(12) United States Patent
Lotfi et al.

(10) Patent No.: US 8,018,315 B2
(45) Date of Patent: Sep. 13, 2011

(54) POWER CONVERTER EMPLOYING A MICROMAGNETIC DEVICE

(75) Inventors: Ashraf W. Lotfi, Bridgewater, NJ (US); Trifon M. Liakopoulos, Bridgewater, NJ (US); Robert W. Filas, Basking Ridge, NJ (US)

(73) Assignee: Enpirion, Inc., Hampton, NJ (US)

( * ) Notice: Subject to any disclaimer, the term of this patent is extended or adjusted under 35 U.S.C. 154(b) by 366 days.

(21) Appl. No.: 11/852,703

(22) Filed: Sep. 10, 2007

(65) Prior Publication Data

US 2009/0066468 A1 Mar. 12, 2009

(51) Int. Cl.
*H01F 27/24* (2006.01)
*H01F 5/00* (2006.01)
*H01F 27/28* (2006.01)
*H01F 17/06* (2006.01)
*G05F 1/00* (2006.01)

(52) U.S. Cl. ........ 336/233; 336/200; 336/222; 336/178; 336/212; 336/223; 323/282; 323/268

(58) Field of Classification Search .................. None
See application file for complete search history.

(56) References Cited

U.S. PATENT DOCUMENTS

| | | | |
|---|---|---|---|
| 1,889,398 A | 11/1932 | Bishop | |
| 2,600,473 A | 6/1952 | Brockman | |
| 3,210,707 A | 10/1965 | Constantakes | |
| 3,691,497 A | 9/1972 | Bailey et al. | |
| 3,762,039 A | 10/1973 | Douglass et al. | |
| 3,902,148 A | 8/1975 | Drees et al. | |
| 3,908,264 A | 9/1975 | Friberg et al. | |
| 4,101,389 A * | 7/1978 | Uedaira | 205/258 |
| 4,103,267 A | 7/1978 | Olschewski | |
| 4,187,128 A * | 2/1980 | Billings et al. | 148/121 |
| 4,199,743 A | 4/1980 | Martincic | |
| 4,433,927 A | 2/1984 | Cavallari | |
| 4,586,436 A | 5/1986 | Denney et al. | |

(Continued)

FOREIGN PATENT DOCUMENTS

GB 2 041 818 A 9/1980

(Continued)

OTHER PUBLICATIONS

"Technical Specification: PMF 8000 Series: POL Regulator, Input 10.8-13.2 V, Output 10 A/55 W," EN/LZT 146 318 R1C, Sep. 2006, pp. 1-47, Ericsson Power Modules AB, Stockholm, Sweden.

(Continued)

*Primary Examiner* — Anh T Mai
*Assistant Examiner* — Mangtin Lian
(74) *Attorney, Agent, or Firm* — Slater & Matsil, L.L.P.

(57) ABSTRACT

A power converter including a power train, a controller and a driver. The power train includes a switch that conducts for a duty cycle and provides a regulated output characteristic for the power converter, and a micromagnetic device interposed between the switch and the output of the power converter. The micromagnetic device includes a substrate, and a magnetic core layer formed over the substrate from a magnetic alloy including iron, cobalt and phosphorous. A content of the cobalt is in a range of 1.8 to 4.5 atomic percent. A content of the phosphorus is in a range of 20.1 to 30 atomic percent. A content of the iron is substantially a remaining proportion of the magnetic alloy. The controller provides a signal to control the duty cycle of the switch. The driver provides a drive signal to the switch as a function of the signal from the controller.

20 Claims, 33 Drawing Sheets

U.S. PATENT DOCUMENTS

| | | |
|---|---|---|
| 4,636,752 A | 1/1987 | Saito |
| 4,668,310 A * | 5/1987 | Kudo et al. ............ 148/304 |
| 4,681,718 A | 7/1987 | Oldham |
| 4,751,199 A | 6/1988 | Phy |
| 4,754,317 A | 6/1988 | Comstock et al. |
| 4,808,118 A | 2/1989 | Wilson et al. |
| 4,847,986 A | 7/1989 | Meinel |
| 4,870,224 A | 9/1989 | Smith et al. |
| 4,916,522 A | 4/1990 | Cohn |
| 4,975,671 A | 12/1990 | Dirks |
| 5,056,214 A | 10/1991 | Holt |
| 5,059,278 A | 10/1991 | Cohen et al. |
| 5,096,513 A * | 3/1992 | Sawa et al. ............ 148/304 |
| 5,118,298 A | 6/1992 | Murphy |
| 5,187,119 A | 2/1993 | Cech et al. |
| 5,262,296 A | 11/1993 | Ogawa et al. |
| 5,279,988 A | 1/1994 | Saadat et al. |
| 5,285,369 A | 2/1994 | Balakrishnan |
| 5,345,670 A | 9/1994 | Pitzele et al. |
| 5,353,001 A | 10/1994 | Meinel et al. |
| 5,428,245 A | 6/1995 | Lin et al. |
| 5,436,409 A | 7/1995 | Sawada et al. |
| 5,469,334 A | 11/1995 | Balakrishnan |
| 5,484,494 A * | 1/1996 | Oda et al. ............ 148/561 |
| 5,524,334 A | 6/1996 | Boesel |
| 5,574,273 A | 11/1996 | Nakagawa et al. |
| 5,574,420 A * | 11/1996 | Roy et al. ............ 336/200 |
| 5,578,261 A | 11/1996 | Manzione et al. |
| 5,692,296 A | 12/1997 | Variot |
| 5,783,025 A | 7/1998 | Hwang et al. |
| 5,787,569 A * | 8/1998 | Lotfi et al. ............ 29/602.1 |
| 5,788,854 A | 8/1998 | Desaigoudar et al. |
| 5,802,702 A | 9/1998 | Fleming et al. |
| 5,807,959 A | 9/1998 | Wu et al. |
| 5,834,691 A | 11/1998 | Aoki |
| 5,835,350 A | 11/1998 | Stevens |
| 5,837,155 A | 11/1998 | Inagaki et al. |
| 5,846,441 A | 12/1998 | Roh |
| 5,898,991 A | 5/1999 | Fogel et al. |
| 5,920,249 A | 7/1999 | Huss |
| 5,973,923 A | 10/1999 | Jitaru |
| 5,998,925 A | 12/1999 | Shimizu et al. |
| 6,005,377 A | 12/1999 | Chen et al. |
| 6,060,176 A | 5/2000 | Semkow et al. |
| 6,081,997 A | 7/2000 | Chia et al. |
| 6,094,123 A | 7/2000 | Roy |
| 6,118,351 A | 9/2000 | Kossives et al. |
| 6,118,360 A | 9/2000 | Neff |
| 6,160,721 A * | 12/2000 | Kossives et al. ............ 363/15 |
| 6,255,714 B1 | 7/2001 | Kossives et al. |
| 6,317,948 B1 | 11/2001 | Kola et al. |
| 6,353,379 B1 | 3/2002 | Busletta et al. |
| 6,366,486 B1 | 4/2002 | Chen et al. |
| 6,440,750 B1 * | 8/2002 | Feygenson et al. ............ 438/3 |
| 6,466,454 B1 | 10/2002 | Jitaru |
| 6,479,981 B2 | 11/2002 | Schweitzer, Jr. et al. |
| 6,495,019 B1 | 12/2002 | Filas et al. |
| 6,541,819 B2 | 4/2003 | Lotfi et al. |
| 6,549,409 B1 | 4/2003 | Saxelby, Jr. et al. |
| 6,578,253 B1 | 6/2003 | Herbert |
| 6,608,332 B2 | 8/2003 | Shimizu et al. |
| 6,624,498 B2 * | 9/2003 | Filas et al. ............ 257/528 |
| 6,649,422 B2 | 11/2003 | Kossives et al. |
| 6,691,398 B2 | 2/2004 | Gutierrez |
| 6,731,002 B2 | 5/2004 | Choi |
| 6,747,538 B2 | 6/2004 | Kuwata et al. |
| 6,790,379 B2 * | 9/2004 | Aoki et al. ............ 252/62.64 |
| 6,912,781 B2 | 7/2005 | Morrison et al. |
| 6,922,130 B2 | 7/2005 | Okamoto |
| 6,989,121 B2 | 1/2006 | Thummel |
| 6,998,952 B2 | 2/2006 | Zhou et al. |
| 7,015,544 B2 | 3/2006 | Lotfi et al. |
| 7,019,505 B2 | 3/2006 | Dwarakanath et al. |
| 7,020,295 B2 | 3/2006 | Hamada et al. |
| 7,021,518 B2 | 4/2006 | Kossives et al. |
| 7,038,438 B2 * | 5/2006 | Dwarakanath et al. ....... 323/283 |
| 7,057,486 B2 | 6/2006 | Kiko |
| 7,101,737 B2 | 9/2006 | Cobbley |
| 7,175,718 B2 * | 2/2007 | Nobutoki et al. ............ 148/302 |
| 7,180,395 B2 | 2/2007 | Lotfi et al. |
| 7,214,985 B2 | 5/2007 | Lotfi et al. |
| 7,229,886 B2 | 6/2007 | Lotfi et al. |
| 7,230,302 B2 | 6/2007 | Lotfi et al. |
| 7,230,316 B2 | 6/2007 | Yamazaki et al. |
| 7,232,733 B2 | 6/2007 | Lotfi et al. |
| 7,236,086 B1 | 6/2007 | Vinciarelli et al. |
| 7,244,994 B2 | 7/2007 | Lotfi et al. |
| 7,250,842 B1 | 7/2007 | Johnson et al. |
| 7,256,674 B2 | 8/2007 | Lotfi et al. |
| 7,276,998 B2 | 10/2007 | Lotfi et al. |
| 7,330,017 B2 | 2/2008 | Dwarakanath et al. |
| 7,426,780 B2 | 9/2008 | Lotfi et al. |
| 7,434,306 B2 | 10/2008 | Gardner |
| 7,462,317 B2 | 12/2008 | Lotfi et al. |
| 7,498,522 B2 | 3/2009 | Itoh |
| 7,544,995 B2 | 6/2009 | Lotfi et al. |
| 7,688,172 B2 | 3/2010 | Lotfi et al. |
| 7,786,837 B2 | 8/2010 | Hebert |
| 7,791,440 B2 | 9/2010 | Ramadan et al. |
| 2001/0030595 A1 | 10/2001 | Hamatani et al. |
| 2001/0041384 A1 | 11/2001 | Ohgiyama et al. |
| 2002/0153258 A1 | 10/2002 | Filas et al. |
| 2003/0062541 A1 | 4/2003 | Warner |
| 2003/0076662 A1 | 4/2003 | Miehling |
| 2003/0232196 A1 * | 12/2003 | Anand et al. ............ 428/405 |
| 2004/0130428 A1 | 7/2004 | Mignano et al. |
| 2004/0150500 A1 | 8/2004 | Kiko |
| 2005/0011672 A1 | 1/2005 | Alawani et al. |
| 2005/0167756 A1 | 8/2005 | Lotfi et al. |
| 2005/0168203 A1 | 8/2005 | Dwarakanath et al. |
| 2005/0168205 A1 | 8/2005 | Dwarakanath et al. |
| 2005/0169024 A1 | 8/2005 | Dwarakanath et al. |
| 2005/0212132 A1 | 9/2005 | Hsuan et al. |
| 2006/0009023 A1 | 1/2006 | Nair et al. |
| 2006/0038225 A1 | 2/2006 | Lotfi et al. |
| 2006/0040449 A1 * | 2/2006 | Lotfi et al. ............ 438/303 |
| 2006/0040452 A1 * | 2/2006 | Lotfi et al. ............ 438/305 |
| 2006/0081937 A1 * | 4/2006 | Lotfi et al. ............ 257/369 |
| 2006/0096087 A1 | 5/2006 | Lotfi et al. |
| 2006/0096088 A1 | 5/2006 | Lotfi et al. |
| 2006/0097831 A1 | 5/2006 | Lotfi et al. |
| 2006/0097832 A1 | 5/2006 | Lotfi et al. |
| 2006/0097833 A1 | 5/2006 | Lotfi et al. |
| 2006/0109072 A1 * | 5/2006 | Giandalia et al. ............ 336/200 |
| 2006/0145800 A1 | 7/2006 | Dadafshar et al. |
| 2006/0197207 A1 | 9/2006 | Chow et al. |
| 2007/0025092 A1 | 2/2007 | Lee et al. |
| 2007/0074386 A1 | 4/2007 | Lotfi et al. |
| 2007/0075815 A1 | 4/2007 | Lotfi et al. |
| 2007/0075816 A1 | 4/2007 | Lotfi et al. |
| 2007/0075817 A1 | 4/2007 | Lotfi et al. |
| 2007/0246808 A1 | 10/2007 | Ewe et al. |
| 2008/0001701 A1 * | 1/2008 | Gardner et al. ............ 336/223 |
| 2008/0090079 A1 * | 4/2008 | Fajardo et al. ............ 428/402 |
| 2008/0258274 A1 | 10/2008 | Sinaga et al. |
| 2008/0258278 A1 | 10/2008 | Ramos et al. |
| 2008/0301929 A1 | 12/2008 | Lotfi et al. |
| 2009/0004774 A1 | 1/2009 | Lee et al. |
| 2009/0057822 A1 | 3/2009 | Wen et al. |
| 2009/0066300 A1 | 3/2009 | Lotfi et al. |
| 2009/0066467 A1 | 3/2009 | Lotfi et al. |
| 2009/0068347 A1 | 3/2009 | Lotfi et al. |
| 2009/0068400 A1 | 3/2009 | Lotfi et al. |
| 2009/0068761 A1 | 3/2009 | Lotfi et al. |
| 2009/0146297 A1 | 6/2009 | Badakere et al. |
| 2010/0084750 A1 | 4/2010 | Lotfi et al. |
| 2010/0087036 A1 | 4/2010 | Lotfi et al. |
| 2010/0164449 A1 | 7/2010 | Dwarakanath et al. |
| 2010/0164650 A1 | 7/2010 | Abou-Alfotouh et al. |
| 2010/0212150 A1 | 8/2010 | Lotfi et al. |
| 2010/0214746 A1 | 8/2010 | Lotfi et al. |

FOREIGN PATENT DOCUMENTS

| | | |
|---|---|---|
| JP | 01072517 | 3/1989 |
| JP | 2-228013 A | 9/1990 |

| | | |
|---|---|---|
| JP | 5-314885 | 11/1993 |
| JP | 6-251958 | 9/1994 |
| JP | 06-251958 A | 9/1994 |

OTHER PUBLICATIONS

Betancourt-Zamora, R.J., et al., "A 1.5 mW, 200 MHz CMOS VCO for Wireless Biotelemetry," First International Workshop on Design of Mixed-Mode Integrated Circuits and Applications, Jul. 1997, pp. 72-74, Cancun, Mexico.

Goodman, J., et al., "An Energy/Security Scalable Encryption Processor Using an Embedded Variable Voltage DC/DC Converter," IEEE Journal of Solid-State Circuits, Nov. 1998, pp. 1799-1809, vol. 33, No. 11, IEEE, Los Alamitos, CA.

Horowitz, P., et al., "The Art of Electronics," Second Edition, 1989, Chapter 5: Active Filters and Oscillators, pp. 288-291, Cambridge University Press, Cambridge, MA.

Lotfi, A.W., et al., "Issues and Advances in High-Frequency Magnetics for Switching Power Supplies," Proceedings of the IEEE, Jun. 2001, pp. 833-845, vol. 89, No. 6, IEEE, Los Alamitos, CA.

Sato, M., et al., "Influences of Molding Conditions on Die-pad Behavior in IC Encapsulation Process Analyzed by Hall Element Method," IEEE Transactions on Advanced Packaging, Aug. 2000, pp. 574-581, vol. 23, No. 3, IEEE, Los Alamitos, CA.

* cited by examiner

POWER CONVERTER EMPLOYING A MICROMAGNETIC DEVICE

TECHNICAL FIELD

The invention is directed, in general, to magnetic devices and, more specifically, to a micromagnetic device, method of forming and power converter employing the same, and an electroplating tool and electrolyte employable for constructing a magnetic core layer of the micromagnetic device, and a method of processing a substrate and micromagnetic device.

BACKGROUND

A switch mode power converter (also referred to as a "power converter") is a power supply or power processing circuit that converts an input voltage waveform into a specified output voltage waveform, which is typically a well-regulated voltage in electronic device applications. Power converters are frequently employed to power loads having tight voltage regulation characteristics such as a microprocessor with, for instance, a bias voltage of one volt or less provided by the power converter. To provide the voltage conversion and regulation functions, power converters include a reactive circuit element such as an inductor that is periodically switched to the input voltage waveform at a switching frequency that may be on the order of ten megahertz or more by an active switch such as a metal-oxide semiconductor field-effect transistor ("MOSFET") that is coupled to the input voltage waveform.

A power converter configured to power an integrated circuit such as a microprocessor formed with submicron size features is generally referred to as a "point-of-load device," and the integrated circuit is typically located close to the point-of-load power converter to limit voltage drop and losses in the conductors that couple the devices together. In such applications, a point-of-load power converter may be required to provide substantial current such as ten amperes or more to the integrated circuit. As current levels for integrated circuit loads continue to increase and the bias voltages decrease with on-going reductions in integrated-circuit feature sizes, the size of the power converter and its power conversion efficiency become important design considerations for product acceptance in challenging applications for emerging markets.

A recent development direction for reducing the size of point-of-load power converters has been to integrate the magnetic circuit elements therein, such as an isolation transformer or an output filter inductor, onto the same silicon substrate that is used to form the integrated control and switching functions of the power converter. These design directions have led to the development of micromagnetic devices with conductive and magnetic structures such as conductive windings and magnetic cores with micron-scaled dimensions to complement the similarly sized elements in logic and control circuits and in the power switches. The integrated magnetic circuit elements are therein produced with manufacturing processes and materials that are fully compatible with the processes and materials used to produce the corresponding semiconductor-based circuit components. The result of the device integration efforts has been to produce single-chip power converters including planar inductors and transformers capable of operation at the high switching frequencies that are necessary for point-of-load power converters to provide the necessary small physical dimensions.

As an example of a process to form a magnetic device that can be integrated onto a semiconductor substrate, Feygenson, et al. ("Feygenson"), in U.S. Pat. No. 6,440,750, entitled "Method of Making Integrated Circuit Having a Micromagnetic Device," issued Aug. 27, 2002, which is incorporated herein by reference, describe a micromagnetic core formed on a semiconductor substrate by depositing Permalloy (typically 80% nickel and 20% iron) in the presence of a magnetic field. Dimensions of the core are designed using conformal mapping techniques. The magnetic field selectively orients the resulting magnetic domains in the micromagnetic core, thereby producing a magnetically anisotropic device with "easy" and "hard" directions of magnetization, and with corresponding reduction in magnetic core losses at high switching frequencies compared to an isotropic magnetic device. Feygenson further describes depositing a thin chromium and silver film to form a seed layer for further deposition of magnetic material to form a planar magnetic core by an electroplating process that has good adhesion to an insulating oxide layer that is formed on a semiconductor (or other suitable) substrate. The chromium and silver seed layer is etched with a cerric ammonium nitrate reagent without substantial effect on the magnetic alloy.

Filas, et al., in U.S. Pat. No. 6,624,498, entitled "Micromagnetic Device Having Alloy of Cobalt, Phosphorus and Iron," issued Sep. 23, 2003, which is incorporated herein by reference, describe a planar micromagnetic device formed with a photoresist that is etched but retained between magnetic core and conductive copper layers. The micromagnetic device includes a planar magnetic core of an amorphous cobalt-phosphorous-iron alloy, wherein the fractions of cobalt and phosphorus are in the ranges of 5-15% and 13-20%, respectively, and iron being the remaining fraction. Magnetic saturation flux densities in the range of 10-20 Kilogauss ("kG") are achievable, and low loss in the magnetic core structure is obtained by depositing multiple insulated magnetic layers, each with a thickness less than the skin depth at the switching frequency of the power converter [e.g., about 2.5 micrometers ("μm") at 8 megahertz ("MHz") for relative permeability of $\mu_r 1000$]. Thin seed layers of titanium and gold are deposited before performing an electroplating process for the magnetic core, and are oxidized and etched without substantial degradation of exposed adjacent conductive copper layers. The planar magnetic core is formed using an electroplating process in an electrolyte with pH about three containing ascorbic acid, sodium biphosphate, ammonium sulfate, cobalt sulfate, and ferrous sulfate. As described by Kossives, et al., in U.S. Pat. No. 6,649,422, entitled "Integrated Circuit Having a Micromagnetic Device and a Method of Manufacture Therefore," issued Nov. 18, 2003, which is incorporated herein by reference, an integrated device formed on a semiconductor substrate includes a planar magnetic device, a transistor, and a capacitor so that the principal circuit elements of a power converter can be integrated onto a single semiconductor chip.

Thus, although substantial progress has been made in development of techniques for production of a highly integrated power converter that is formed on a single chip, these processes are not suitable for manufacturing an integrated micromagnetic device in substantial numbers and with the process yields and repeatability necessary to produce the reliability and cost for an end product. In particular, electrolytes for forming magnetic and conductive layers should have sufficient life for continued operation in an ongoing manufacturing environment. The electroplating processes should repeatably deposit uniformly thick layers of high-performance magnetic materials with consistent and predictable properties. In addition, the high-frequency ac properties of a micromagnetic core so deposited should exhibit low and repeatable core loss. Similarly, the conductive windings should exhibit low and repeatable high-frequency resistance.

Accordingly, what is needed in the art is a micromagnetic device and method of producing the same that can be manufactured in high volume and with low cost in a continuing production environment, the necessary electroplating tools and electrolytes therefor, and an electroplateable magnetic alloy with high performance magnetic characteristics at switching frequencies that may exceed one megahertz, that overcome the deficiencies in the prior art. In addition, the resulting micromagnetic device should be dimensionally stable with low internal stresses so that the micromagnetic device remains sufficiently planar to support further processing steps.

SUMMARY OF THE INVENTION

These and other problems are generally solved or circumvented, and technical advantages are generally achieved, by advantageous embodiments of a power converter including a power train, a controller and a driver. In one embodiment, the power train includes a switch configured to conduct for a duty cycle and provide a regulated output characteristic at an output of the power converter, and a micromagnetic device interposed between the switch and the output of the power converter. The micromagnetic device includes a substrate, and a magnetic core layer formed over the substrate from a magnetic alloy. The magnetic alloy includes iron, cobalt and phosphorous. A content of the cobalt is in a range of 1.8 to 4.5 atomic percent. A content of the phosphorus is in a range of 20.1 to 30 atomic percent. A content of the iron is substantially a remaining proportion of the magnetic alloy. The controller of the power converter is configured to provide a signal to control the duty cycle of the switch. The driver of the power converter is configured to provide a drive signal to the switch as a function of the signal from the controller.

In another aspect, a power converter includes a power train, a controller and a driver. In one embodiment, the power train includes a switch configured to conduct for a duty cycle and provide a regulated output characteristic at an output of the power converter, and a micromagnetic device interposed between the switch and the output of the power converter. The micromagnetic device includes a substrate, a magnetic core layer formed over the substrate from a magnetic alloy, an insulating layer formed over the magnetic core layer, and another magnetic core layer formed over the insulating layer from a magnetic alloy. At least one of the magnetic alloys include iron, cobalt and phosphorous. A content of the cobalt is in a range of 1.8 to 4.5 atomic percent. A content of the phosphorus is in a range of 20.1 to 30 atomic percent. A content of the iron is substantially a remaining proportion of the at least one of the magnetic alloys. The controller of the power converter is configured to provide a signal to control the duty cycle of the switch. A driver of the power converter is configured to provide a drive signal to the switch as a function of the signal from the controller.

The foregoing has outlined rather broadly the features and technical advantages of the invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the invention. It should also be realized by those skilled in the art that such equivalent constructions do not depart from the spirit and scope of the invention as set forth in the appended claims.

BRIEF DESCRIPTION OF THE DRAWINGS

For a more complete understanding of the invention, reference is now made to the following descriptions taken in conjunction with the accompanying drawings, in which.

Corresponding numerals and symbols in the different figures generally refer to corresponding parts unless otherwise indicated, and may not be redescribed in the interest of brevity after the first instance. The figures are drawn to clearly illustrate the relevant aspects of the preferred embodiments.

DETAILED DESCRIPTION OF ILLUSTRATIVE EMBODIMENTS

The making and using of embodiments are discussed in detail below. It should be appreciated, however, that the invention provides many applicable inventive concepts that can be embodied in a wide variety of specific contexts. The specific embodiments discussed are merely illustrative of specific ways to make and use the invention, and do not limit the scope of the invention.

The invention will be described with respect to exemplary embodiments in a specific context, namely, a micromagnetic device, method of forming the same and a power converter employing the same. Additionally, an electroplating tool and electrolyte employable for constructing a magnetic core layer of the micromagnetic device will also be described herein. Also, a method of processing a substrate and micromagnetic device to relieve stress induced by a conductive film will be described herein.

Figure 1:
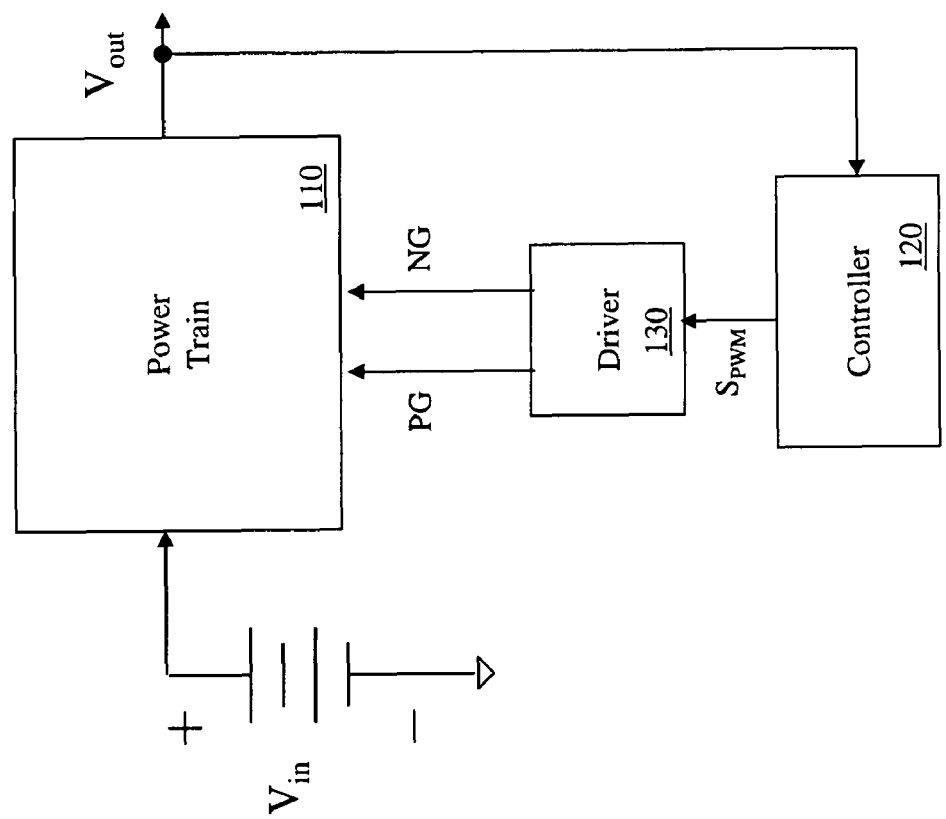
FIG. 1 illustrates a block diagram of an embodiment of a power converter constructed according to the principles of the present invention.

Referring initially to FIG. 1, illustrated is a block diagram of an embodiment of a power converter including an integrated micromagnetic device constructed according to the principles of the invention. The power converter includes a power train 110 coupled to a source of electrical power (represented by a battery) for providing an input voltage $V_{in}$ for the power converter. The power converter also includes a controller 120 and a driver 130, and provides power to a system (not shown) such as a microprocessor coupled to an output thereof. The power train 110 may employ a buck converter topology as illustrated and described with respect to FIG. 2 below. Of course, any number of converter topologies may benefit from the use of an integrated micromagnetic device constructed according to the principles of the invention and are well within the broad scope of the invention.

The power train 110 receives an input voltage $V_{in}$ at an input thereof and provides a regulated output characteristic (e.g., an output voltage $V_{out}$) to power a microprocessor or other load coupled to an output of the power converter. The controller 120 may be coupled to a voltage reference representing a desired characteristic such as a desired system voltage from an internal or external source associated with the microprocessor, and to the output voltage $V_{out}$ of the power converter. In accordance with the aforementioned characteristics, the controller 120 provides a signal $S_{PWM}$ to control a duty cycle and a frequency of at least one power switch of the power train 110 to regulate the output voltage $V_{out}$ or another characteristic thereof by periodically coupling the integrated magnetic device to the input voltage $V_{in}$.

In accordance with the aforementioned characteristics, a drive signal(s) [e.g., a first gate drive signal PG with duty cycle D functional for a P-channel MOSFET ("PMOS") power switch and a second gate drive signal NG with complementary duty cycle 1-D functional for a N-channel MOSFET ("NMOS") power switch] is provided by the driver 130 to control a duty cycle and a frequency of one or more power switches of the power converter, preferably to regulate the output voltage $V_{out}$ thereof. For a better understanding of power converters and related systems and components therein, see U.S. Pat. No. 7,038,438, entitled "Controller for a Power Converter and a Method of Controlling a Switch Thereof," to Dwarakanath, et al., issued May 2, 2006, U.S. Pat. No. 7,019,505, entitled "Digital Controller for a Power Converter Employing Selectable Phases of a Clock Signal," to Dwarakanath, et al., issued Mar. 28, 2006, U.S. Patent Application Publication No. 2005/0168203, entitled "Driver for a Power Converter and a Method of Driving a Switch Thereof," to Dwarakanath, et al., published Aug. 4, 2005, U.S. Patent Application Publication No. 2005/0167756, entitled "Laterally Diffused Metal Oxide Semiconductor Device and Method of Forming the Same," to Lotfi, et al., published Aug. 4, 2005 (now U.S. Pat. No. 7,230,203, issued Jun. 12, 2007), and U.S. Pat. No. 7,214,985, entitled "Integrated Circuit Incorporating Higher Voltage Devices and Low Voltage Devices Therein," to Lotfi, et al., issued May 8, 2007, which are incorporated herein by reference.

Figure 2:
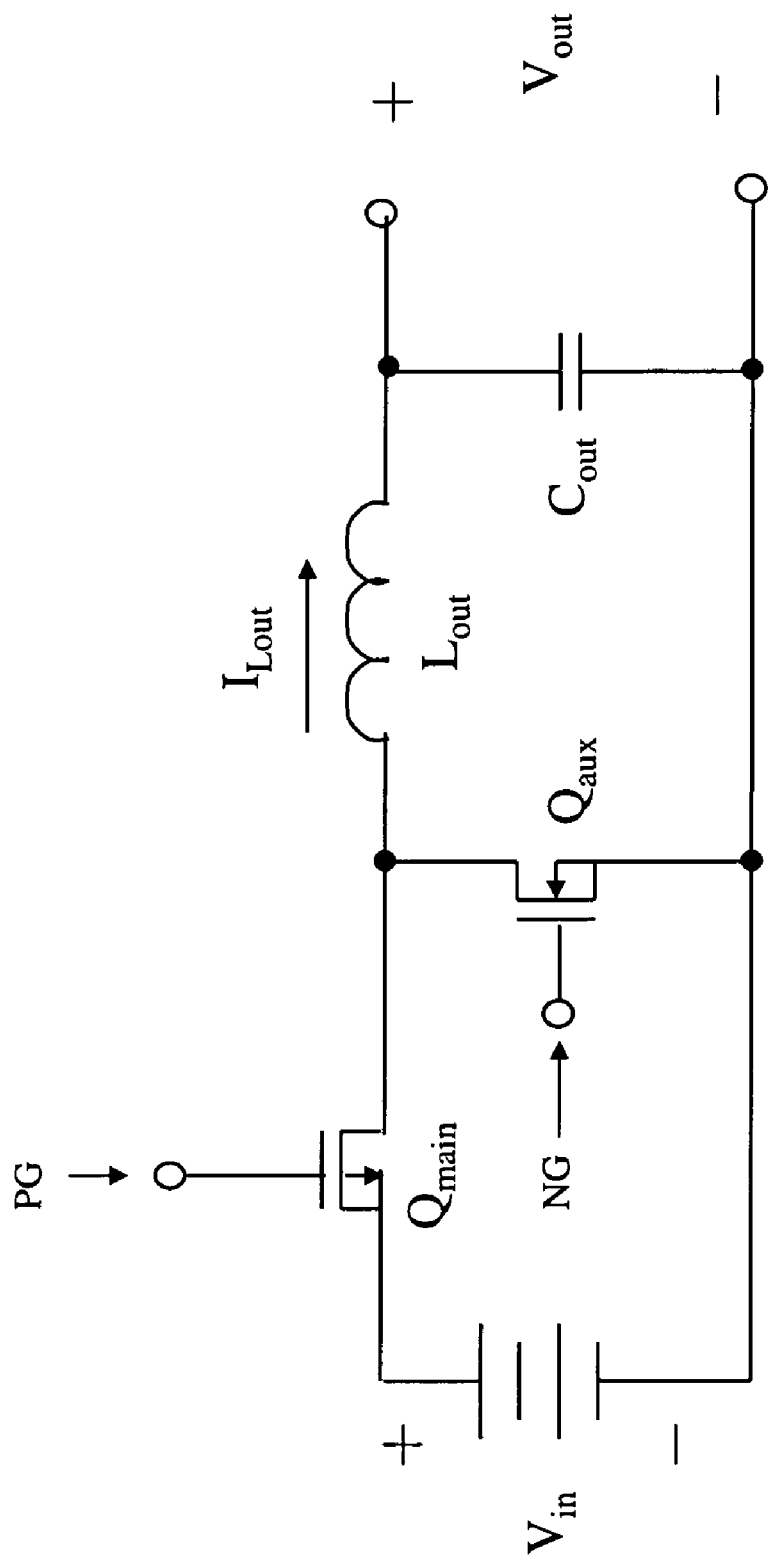
FIG. 2 illustrates a schematic diagram of an embodiment of a power train of a power converter constructed according to the principles of the present invention.

Turning now to FIG. 2, illustrated is a schematic diagram of an embodiment of a power train of a power converter including an integrated micromagnetic device constructed according to the principles of the invention. While in the illustrated embodiment the power train employs a buck converter topology, those skilled in the art should understand that other converter topologies such as a forward converter topology or an active clamp topology are well within the broad scope of the invention.

The power train of the power converter receives an input voltage $V_{in}$ (e.g., an unregulated input voltage) from a source of electrical power (represented by a battery) at an input thereof and provides a regulated output voltage $V_{out}$ to power, for instance, a microprocessor at an output of the power converter. In keeping with the principles of a buck converter topology, the output voltage $V_{out}$ is generally less than the input voltage $V_{in}$ such that a switching operation of the power converter can regulate the output voltage $V_{out}$. A main power switch $Q_{main}$, (e.g., a PMOS switch) is enabled to conduct by a gate drive signal PG for a primary interval (generally co-existent with a duty cycle "D" of the main power switch $Q_{main}$) and couples the input voltage $V_{in}$ to an output filter inductor $L_{out}$, which may be advantageously formed as a micromagnetic device. During the primary interval, an inductor current $I_{Lout}$ flowing through the output filter inductor $L_{out}$ increases as a current flows from the input to the output of the power train. An ac component of the inductor current $I_{Lout}$ is filtered by an output capacitor $C_{out}$.

During a complementary interval (generally co-existent with a complementary duty cycle "1-D" of the main power switch $Q_{main}$), the main power switch $Q_{main}$ is transitioned to a non-conducting state and an auxiliary power switch $Q_{aux}$ (e.g., an NMOS switch) is enabled to conduct by a gate drive signal NG. The auxiliary power switch $Q_{aux}$ provides a path to maintain a continuity of the inductor current $I_{Lout}$ flowing through the micromagnetic output filter inductor $L_{out}$. During the complementary interval, the inductor current $I_{Lout}$ through the output filter inductor $L_{out}$ decreases. In general, the duty cycle of the main and auxiliary power switches $Q_{main}$, $Q_{aux}$ may be adjusted to maintain a regulation of the output voltage $V_{out}$ of the power converter. Those skilled in the art should understand, however, that the conduction periods for the main and auxiliary power switches $Q_{main}$, $Q_{aux}$ may be separated by a small time interval to avoid cross conduction therebetween and beneficially to reduce the switching losses associated with the power converter.

Figure 3:
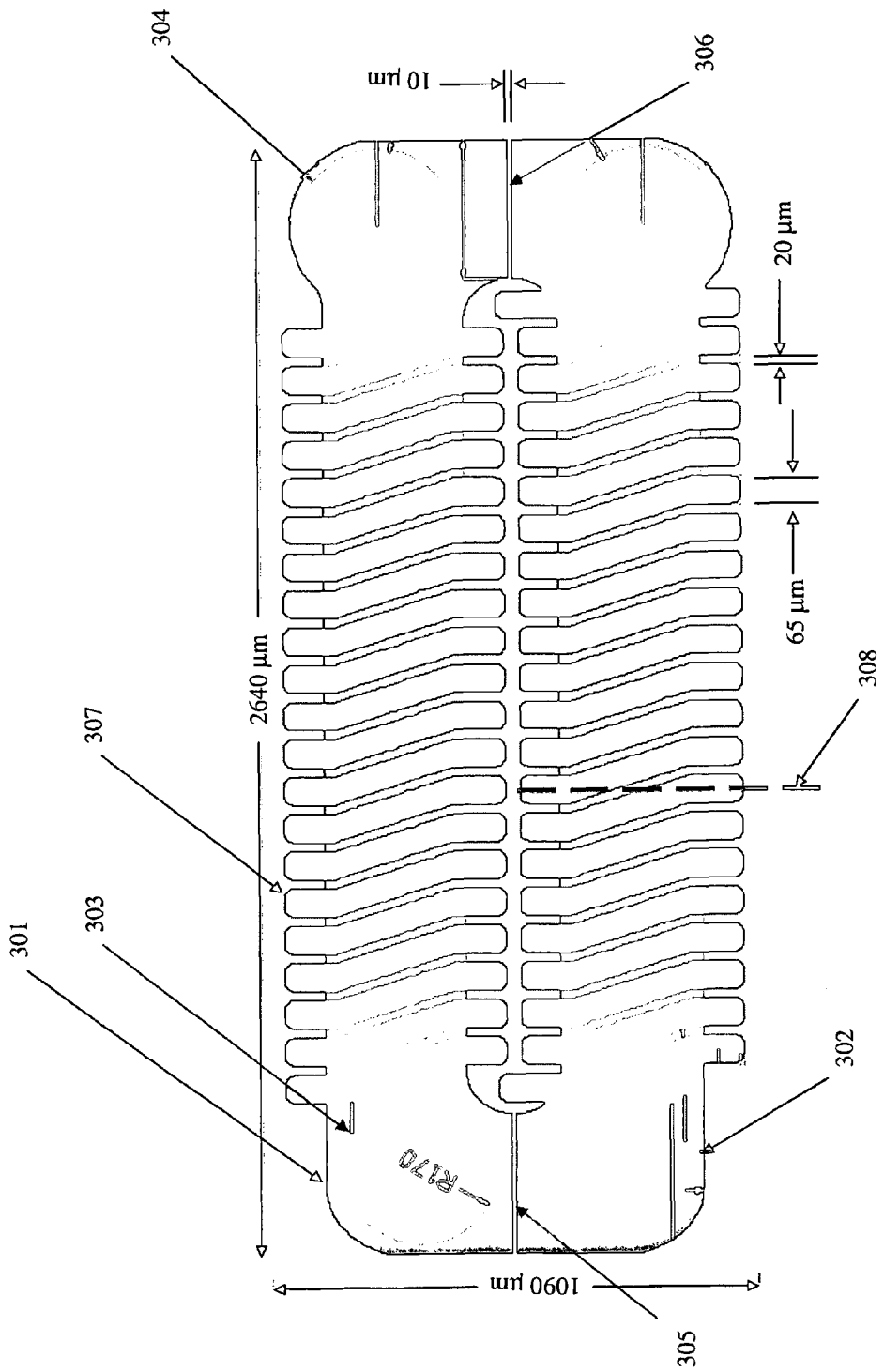
FIG. 3 illustrates a plan view of a micromagnetic device formed according to the principles of the present invention.

Turning now to FIG. 3, illustrated is a plan view of a micromagnetic device formed according to the principles of the invention. The micromagnetic device illustrated herein is an inductor, such as the inductor $L_{out}$ illustrated and described with reference to FIG. 2, that provides an inductance in the range 400-800 nanohenries ("nH") and can conduct a current of approximately one ampere without substantially saturating the magnetic core thereof. The micromagnetic device is formed with a height of about 150 µm over a substrate such as a silicon substrate. In alternative embodiments, the substrate may be formed of glass, ceramic, or various semiconductor materials.

In an advantageous embodiment, the substrate is substantially nonconductive, wherein currents induced in the substrate by high-frequency electromagnetic fields produced by the micromagnetic device do not produce substantial losses in comparison with other parasitic losses inherent within the micromagnetic device. The magnetic and conductive layers of the micromagnetic device are constructed so that it can support a power converter switching frequency of 5-10 MHz without substantial loss in copper conductors or in magnetic core pieces. In an integrated point-of-load power converter to be described hereinbelow, the area of the micromagnetic device is roughly comparable to the area of the semiconductor power switches therein, such as the power switches $Q_{main}$, $Q_{aux}$ illustrated and described with reference to FIG. 2, and the associated integrated control circuits of a power converter employing the same. In an advantageous embodiment, the micromagnetic device is formed on a separate substrate from an integrated control circuit and the semiconductor power switches. It should be understood, however, that the micromagnetic device may be formed on the same substrate as power semiconductor switches and an integrated control circuit. In a related embodiment, the micromagnetic device may be formed over the semiconductor devices on the same substrate.

The micromagnetic device preferably includes iron-cobalt-phosphorus alloy magnetic core pieces 301, 302 and includes gaps 305, 306. An exemplary iron-cobalt-phosphorous alloy will be described in more detail below. In the illustrated embodiment, the gaps 305, 306 are of length about 10 μm. A copper winding 307 encircles the magnetic core pieces 301, 302. Terminal pads (such as first and second terminal pads 303, 304) provide an interconnection to the winding 307 for wire bonds or solder bumps. Three terminal pads are illustrated herein.

The second terminal pad 304 is coupled to and provides a terminal for the winding 307. As illustrated in FIG. 3, the first terminal pad 303 is not coupled to the winding 307, but provides a location for three-point mechanical support of the micromagnetic device. In an alternative embodiment, the first terminal pad 303 may be used to provide a tapped connection to the winding 307, thereby forming a tapped inductor. A fourth terminal pad (not shown) may also be provided in the lower left-hand corner of the micromagnetic device so that the winding 307 may be separated into two dielectrically isolated portions to form an isolating transformer, wherein the top portion of the winding 307 is coupled to the top two terminal pads, and the bottom portion of the winding 307 is coupled to the bottom two terminal pads. A dotted line 308 illustrates the approximate location of an elevation view of the micromagnetic device that will be used in FIGS. 4 to 28 to illustrate a method of forming the micromagnetic device. It should be understood that the dimensions illustrated with respect to the micromagnetic device of FIG. 3 are provided for illustrative purposes only.

The sequence of steps to produce a micromagnetic device formed according to the principles of the invention will now be described. In the interest of brevity, the details of some processing steps well known in the art may not be included in the descriptive material below. For example, without limitation, cleaning steps such as using deionized water or a reactive ionizing chamber may not be described, generally being ordinary techniques well known in the art. The particular concentration of reagents, the exposure times for photoresists, general processing temperatures, current densities for electroplating processes, chamber operating pressures, chamber gas concentrations, radio frequencies to produce ionized gases, etc., are often ordinary techniques well-known in the art, and will not always be included in the description below. Similarly, alternative reagents and processing techniques to accomplish substantially the same result, for example, the substitution of chemical-vapor deposition for sputtering, etc., will not be identified for each processing step, and such substitutions are included within the broad scope of the invention. The dimensions and material compositions of the exemplary embodiment described below also may be altered in alternative designs to meet particular design objectives, and are included within the broad scope of the invention.

Figure 4:
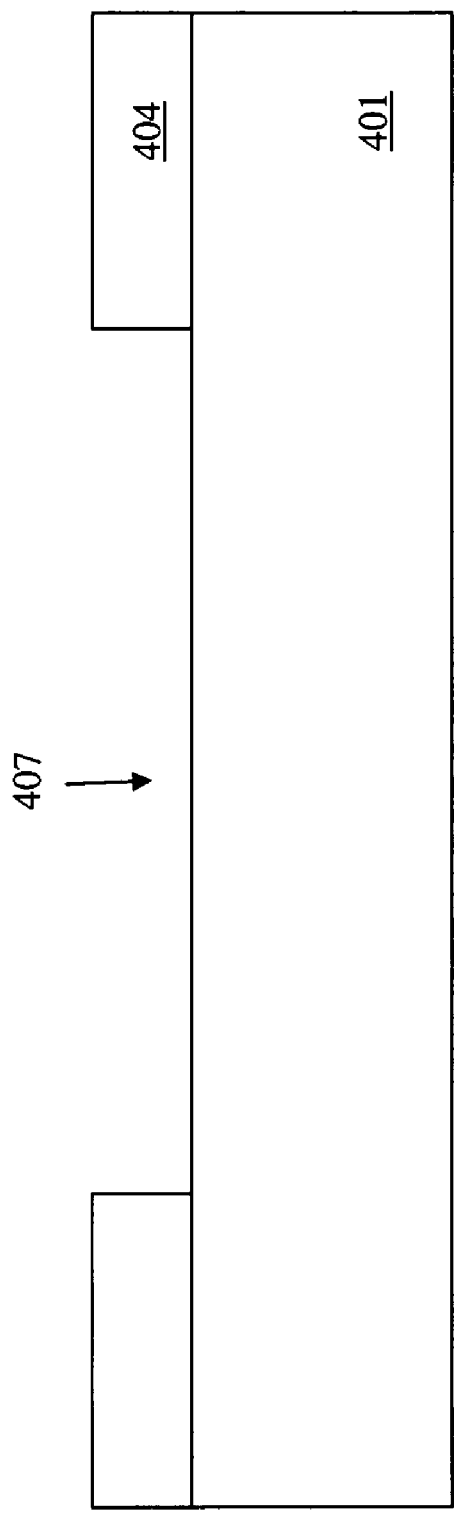
FIGS. 4 to 28 illustrate cross sectional views of a method of forming a micromagnetic device constructed according to the principles of the present invention.

Turning now to FIGS. 4 to 28, illustrated are cross sectional views of a method of forming a micromagnetic device constructed according to the principles of the invention. Beginning with FIG. 4, illustrated is a substrate 401, approximately 1 mm thick, formed from silicon. A first photoresist layer 404 is spun on to a top surface of the substrate 401 and patterned to form an aperture 407, exposing thereby a portion of the substrate 401 for further processing. In the illustrated embodiment, photoresist AZ4330, such as available from AZ Electronic Materials USA Corp., Branchburg, N.J., is spun on using standard photolithography techniques to form a three μm thick patterned film.

Figure 5:
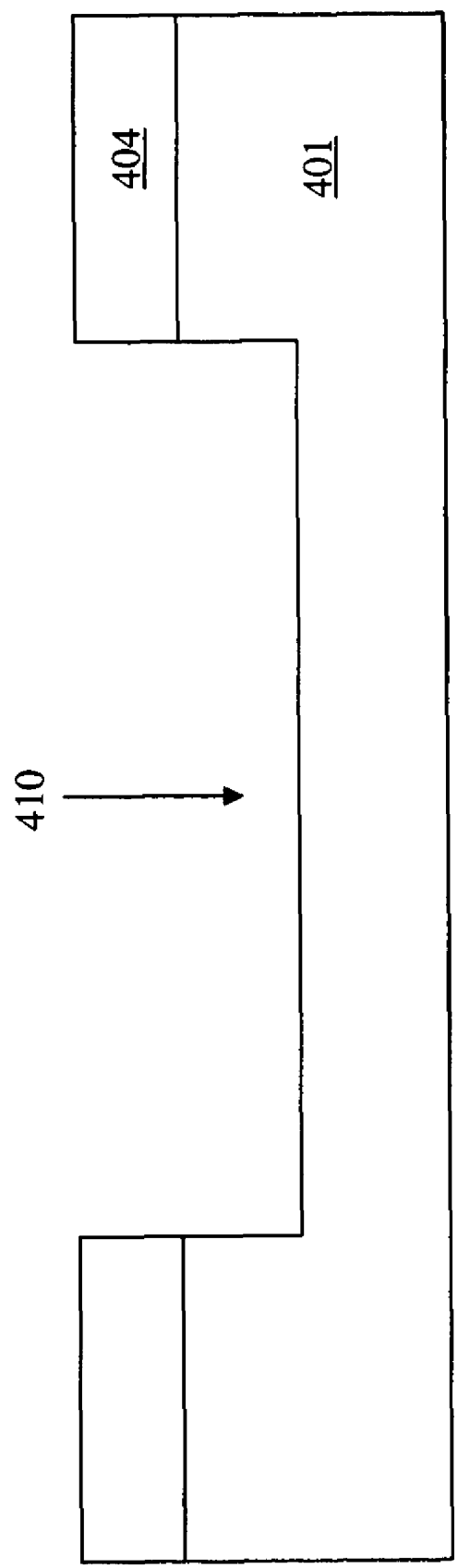

Turning now to FIG. 5, a trench 410 is etched into the substrate 401 to form a depressed area about 50 μm deep that will accommodate a conductive winding layer, preferably copper, formed in a later processing step for a conductive winding. The trench 410 is formed using a deep reactive ion etch ("DRIE") such as the Bosch process. The Bosch process, as is well known in the art, uses a sequence of gases such as sulfur hexafluoride ("$SF_6$") followed by octofluorocyclobutane ("$C_4F_8$") to produce a highly anisotropic etching process that removes exposed portions of the substrate 401 at the bottom of the trench 410. The width of the trench 410 illustrated in FIG. 5 is about 465 μm, and the dimension of the trench 410 out of the plane of the FIGURE is about 70 μm. The first photoresist layer 404 is then removed using techniques well-known in the art.

Figure 6:
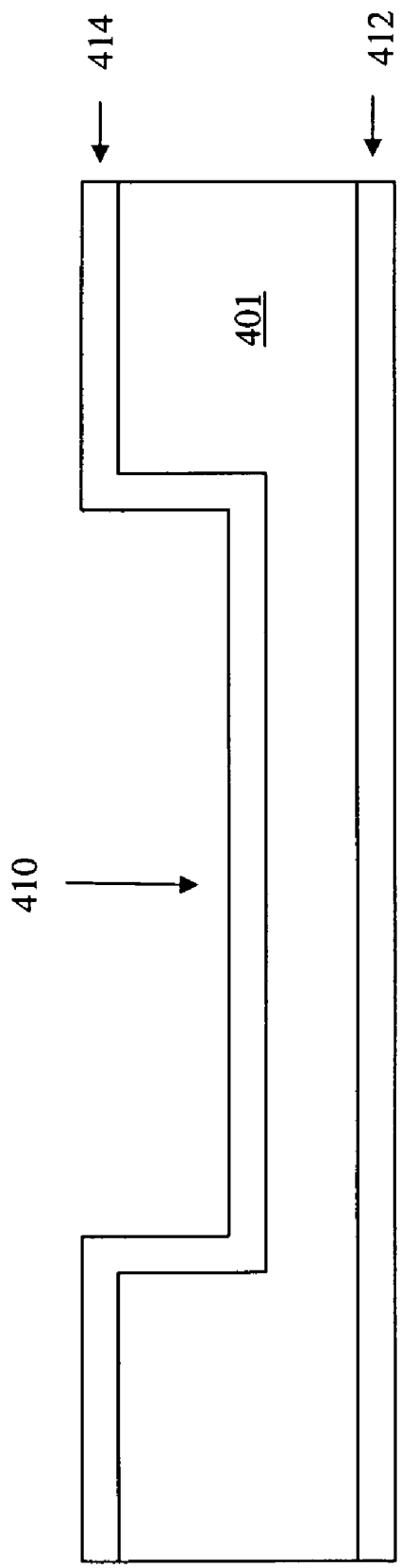

Turning now to FIG. 6, an insulating layer [e.g., a thermal silicon dioxide ("$SiO_2$") insulating layer] is deposited onto each side of the substrate 401, including the trench 410, as illustrated by first and second insulating layers 412, 414. An alternative process for depositing an insulating layer can use a chemical vapor deposition process. In an advantageous embodiment, the thickness of the first and second insulating layers 412, 414 is about five μm on each side of the substrate 401. The thickness of the first and second insulating layers 412, 414 affects residual mechanical stress due to differential thermal expansion of conductive, magnetic, and other layers during device processing steps. The removal of the first insulating layer 412 is a component affecting residual die stress after completion of micromagnetic device processing steps. The thickness of the first and second insulating layers 412, 414 can be adjusted using simulation or experimental techniques to produce a die with low residual mechanical stress after completion of micromagnetic device processing.

Figure 7:
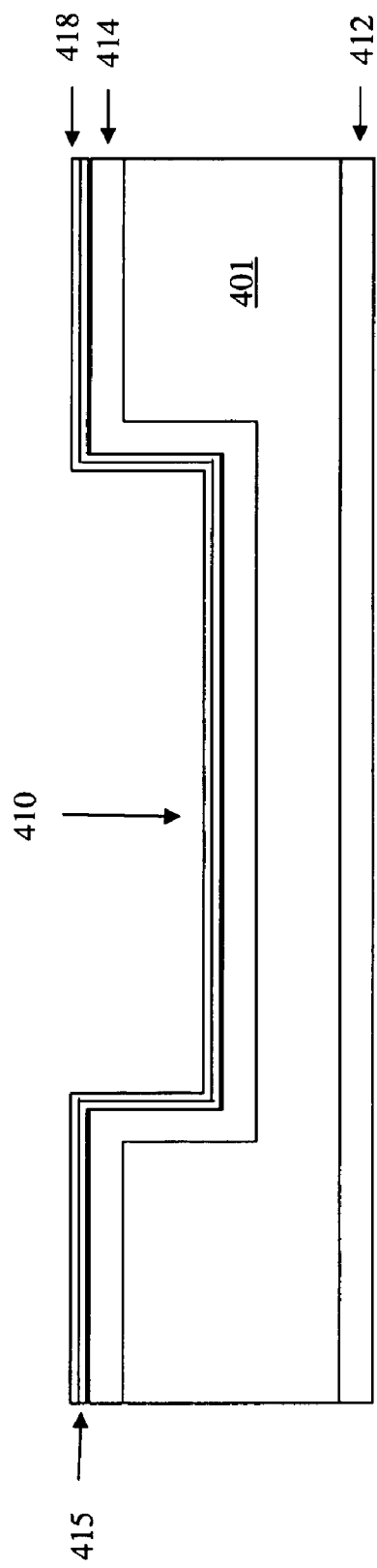

Turning now to FIG. 7, a first adhesive layer 415 of titanium ("Ti") or chromium ("Cr") is sputtered onto the top surface of the micromagnetic device above the second insulating layer 414. Deposition of the first adhesive layer 415 is followed by deposition of a first seed layer 418 (e.g., gold or copper) for a later electroplating step. The first seed layer 418 forms a conductive layer onto which a winding will be deposited in a later processing step. The thickness of the first adhesive layer 415 is preferably about 200 angstroms ("Å"), and the thickness of the overlying first seed layer 418 is preferably about 2000 Å.

Figure 8:
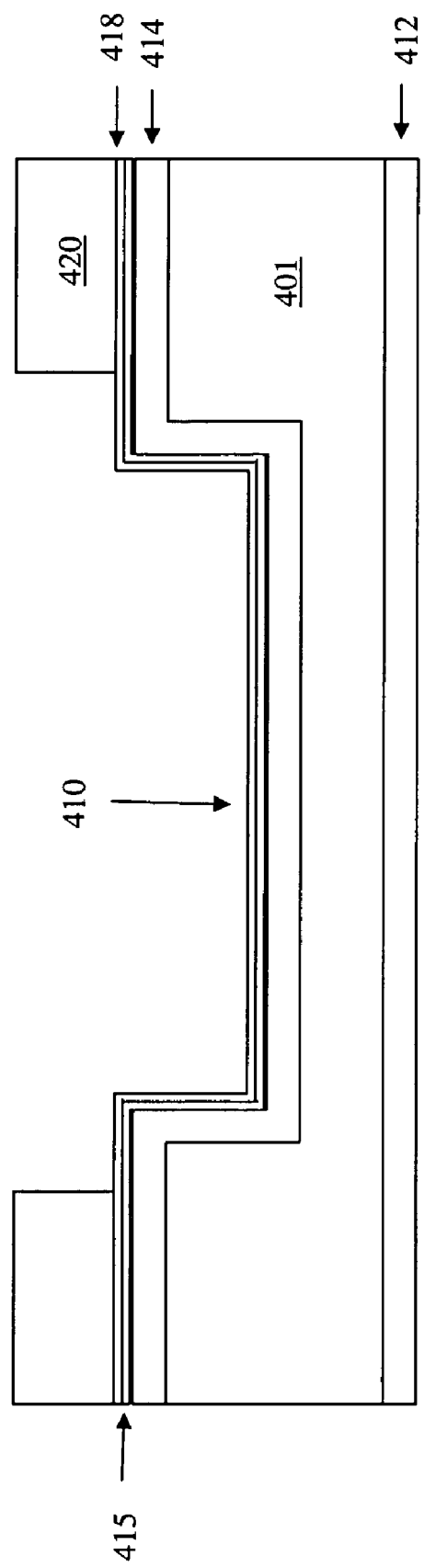

Turning now to FIG. 8, a second photoresist layer 420 is deposited above the first seed layer 418. The second photoresist layer 420 is spun on and patterned to form an aperture substantially above the trench 410, exposing thereby a portion of the first seed layer 418 therebelow. In the illustrated embodiment, the second photoresist layer 420 is NR9 8000 from Futurrex Inc., of Franklin, N.J., and, using standard photolithography techniques, is spun on to produce about a 15 μm thick patterned film.

Figure 9:
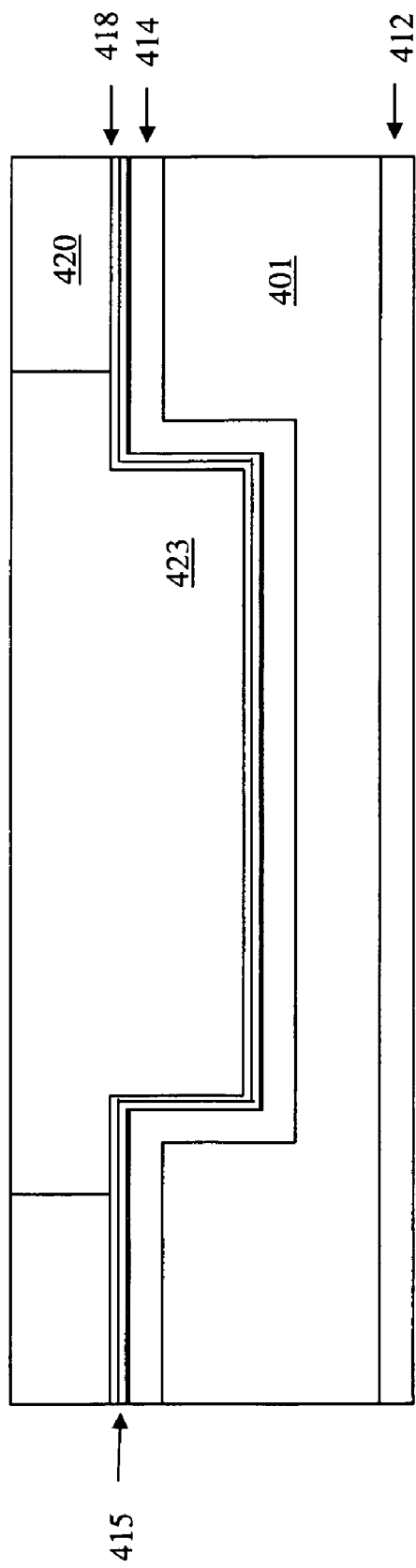
Figure 10:
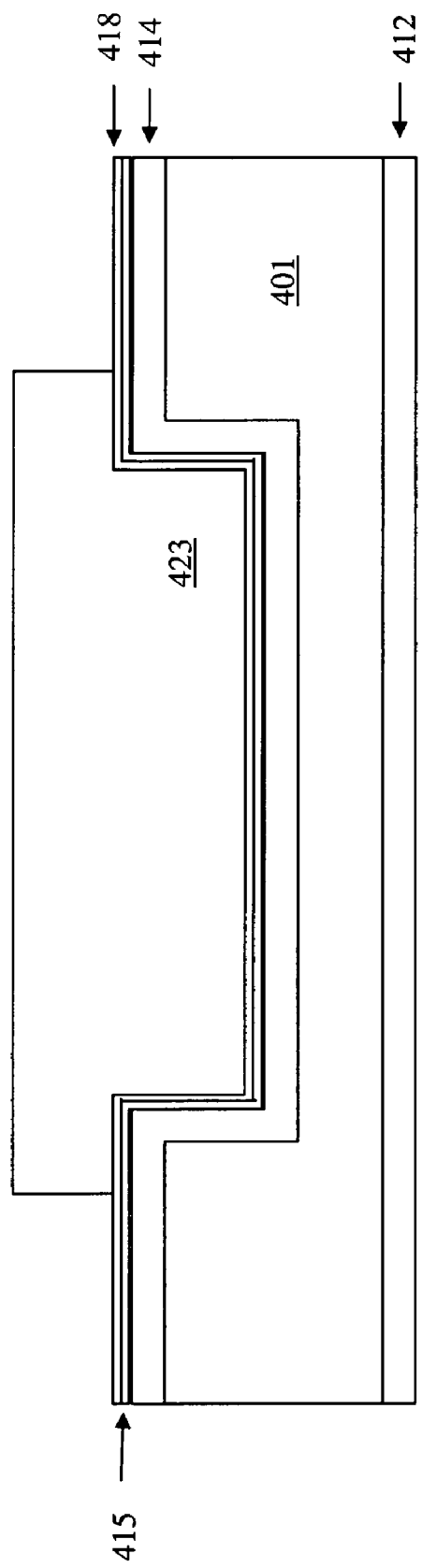

Turning now to FIGS. 9 and 10, a first conductive winding layer 423 to form a first winding section for the micromagnetic device is electroplated onto the exposed first seed layer 418, preferably using an electrolyte and electroplating process as described later hereinbelow. In an advantageous embodiment, the first winding section is formed from copper. As illustrated in FIG. 9, the first conductive winding layer 423 is deposited up to and above the top surface of the second photoresist layer 420. With respect to FIG. 10, the second photoresist layer 420 illustrated previously is stripped off a top surface of the micromagnetic device using conventional photoresist stripping techniques.

Figure 11:
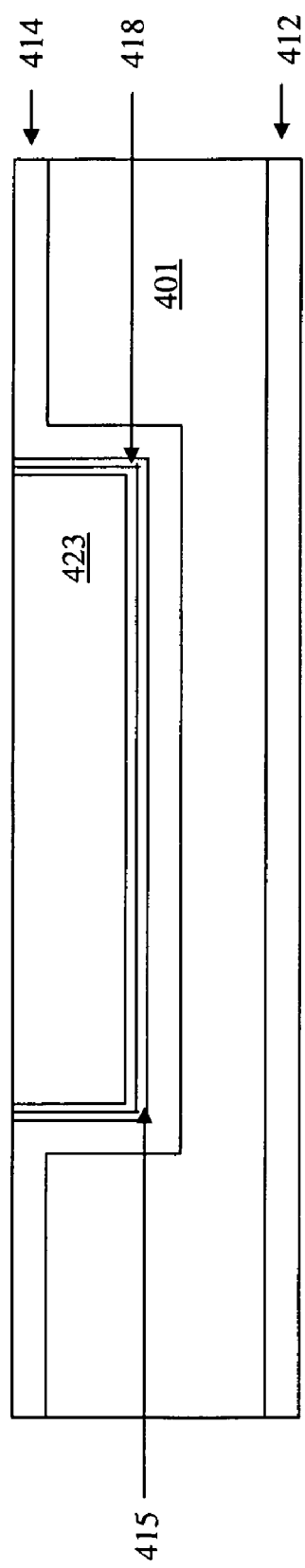

Turning now to FIG. 11, the top surface of the micromagnetic device is polished using a conventional chemical-mechanical polishing ("CMP") process as is known in the art. The result of this process produces a substantially smooth and level surface on the top surface of the micromagnetic device exposing a top surface of the first conductive winding layer 423 and a portion of the second insulating layer 414.

Figure 12:
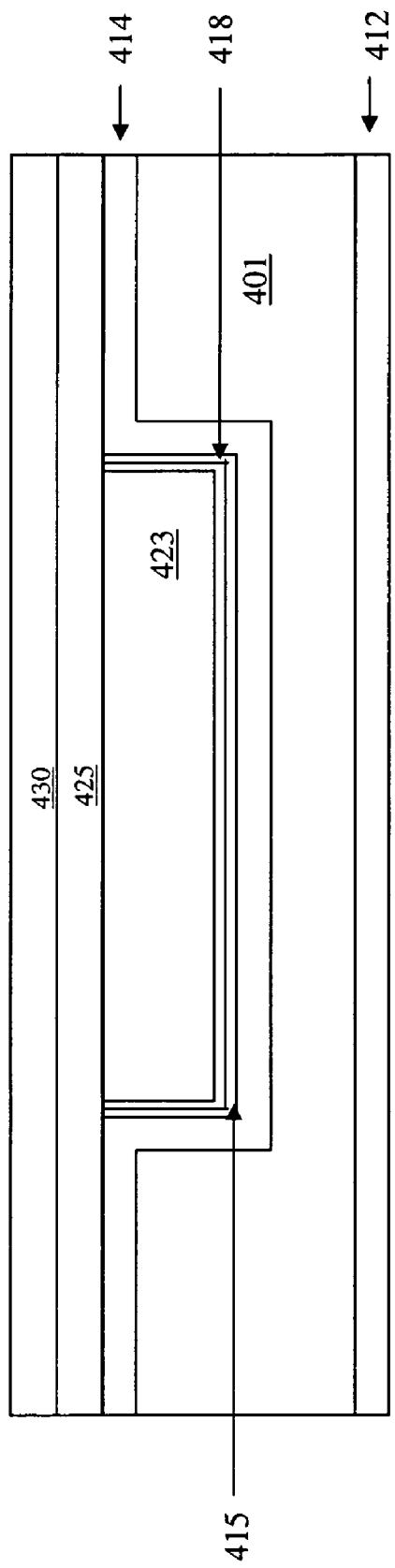

Turning now to FIG. 12, a second adhesive layer 425 (e.g., titanium or chromium, approximately 1000 Å thick) is sputtered onto the top surface of the micromagnetic device followed by a sputtered third insulating layer 430 (e.g., silicon dioxide) approximately 5000 Å thick. An alternative process for depositing the third insulating layer 430 uses a chemical vapor deposition process.

Figure 13:
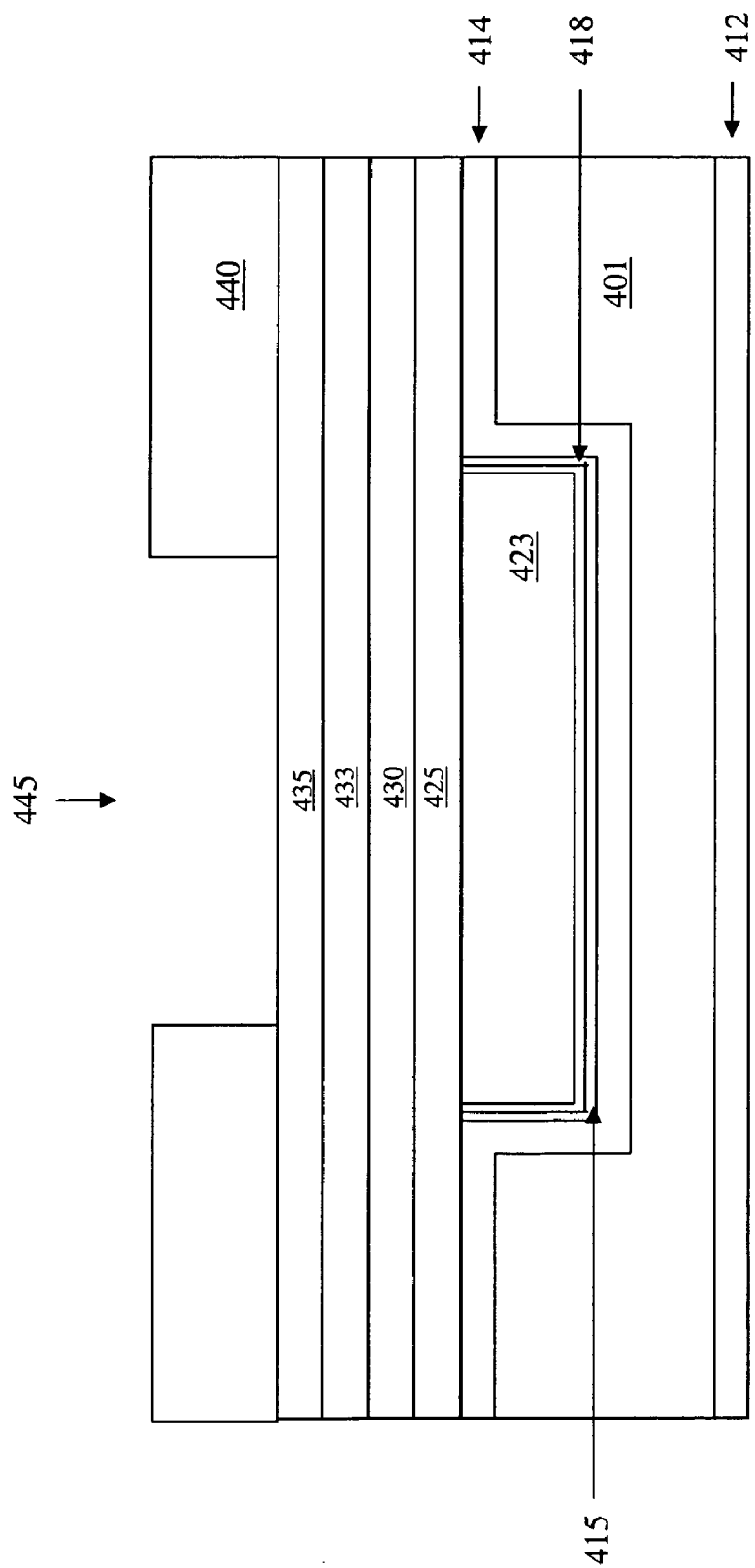

Turning now to FIG. 13, a third adhesive layer 433 of titanium or chromium, preferably 300 Å thick, is deposited by sputtering followed by a second seed layer 435 (e.g., gold or copper) that is 1000 Å thick. A third photoresist layer 440 is then deposited above the second seed layer 435 and patterned with standard photolithography techniques to form a 10 μm thick first photoresist aperture 445 therein exposing portions of the second seed layer 435. The first photoresist aperture 445 is used to define a shape for a first magnetic core layer including an alloy such as an iron-cobalt alloy that is subsequently electroplated. In the illustrated embodiment, the third photoresist layer 440 is AZ9260 from AZ Electronic Materials USA Corp., Branchburg, N.J.

Figure 14:
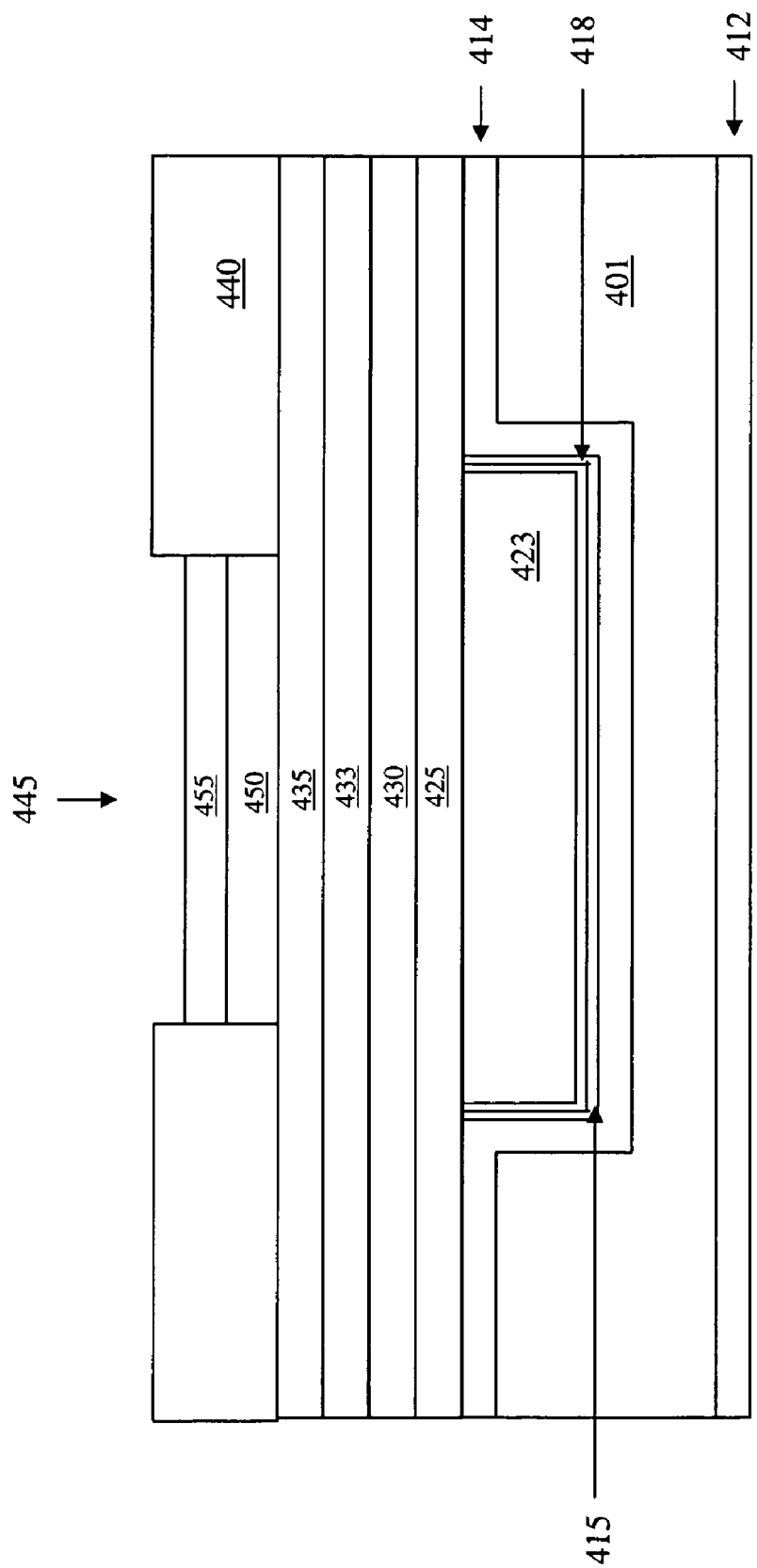

Turning now to FIG. 14, a first magnetic core layer 450 formed from an iron-cobalt alloy is electroplated through the first photoresist aperture 445 illustrated in FIG. 13. In this embodiment, the thickness of the iron-cobalt alloy is about six μm. Following the electroplating process for the iron-cobalt alloy, the substrate is rinsed with carbon dioxide ("$CO_2$")-saturated, de-ionized water and immersed in an electrolyte (e.g., a nickel electrolyte) to form a first protective layer 455 (e.g., a thin nickel protective layer at about 250-300 Å) over the first magnetic core layer 450.

Figure 15:
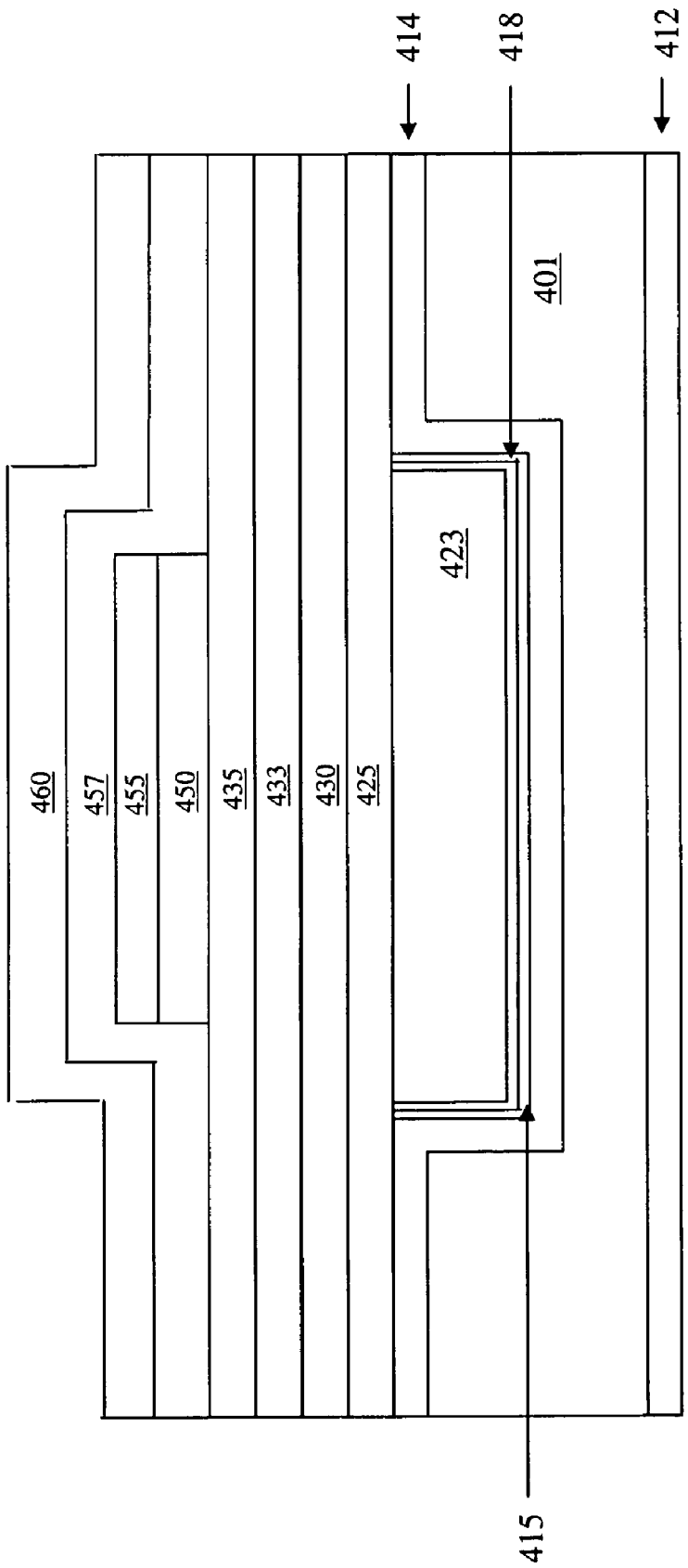

Turning now to FIG. 15, the third photoresist layer 440 is stripped off the top surface of the micromagnetic device using conventional photoresist stripping techniques. A fourth adhesive layer 457 of titanium or chromium is deposited onto the first protective layer 455, followed by a sputter-deposited fourth insulating layer 460 of aluminum oxide or silicon dioxide at about 500 Å.

Figure 16:
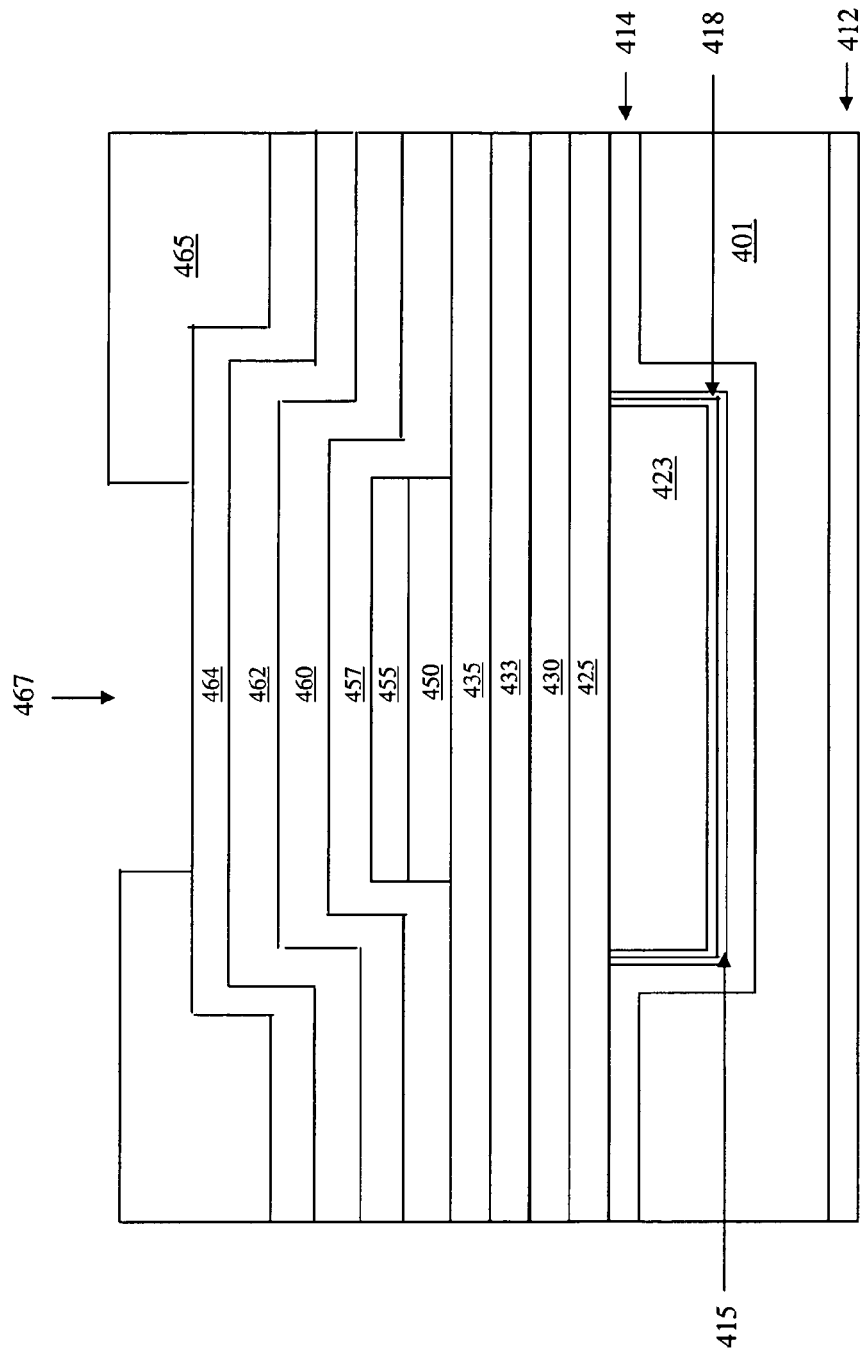

Turning now to FIG. 16, preparation for a second magnetic core layer of an iron-cobalt alloy electroplating process begins with the sputter deposition of a fifth adhesive layer 462 followed by a third seed layer 464 of gold or copper, preferably similar to those used under the first magnetic core layer 450 (e.g., 300 Å of titanium or chromium followed by 1000 Å of gold or copper). A fourth photoresist layer 465 is deposited above the third seed layer 464 and patterned with standard photolithographic techniques to form a 15 μm thick second photoresist aperture 467 employable to define a shape of the second magnetic core layer that is to be electroplated thereabout. The second photoresist aperture 467 exposes the third seed layer 464. In the illustrated embodiment, the fourth photoresist layer 465 is AZ9260 from AZ Electronic Materials USA Corp., Branchburg, N.J.

Figure 17:
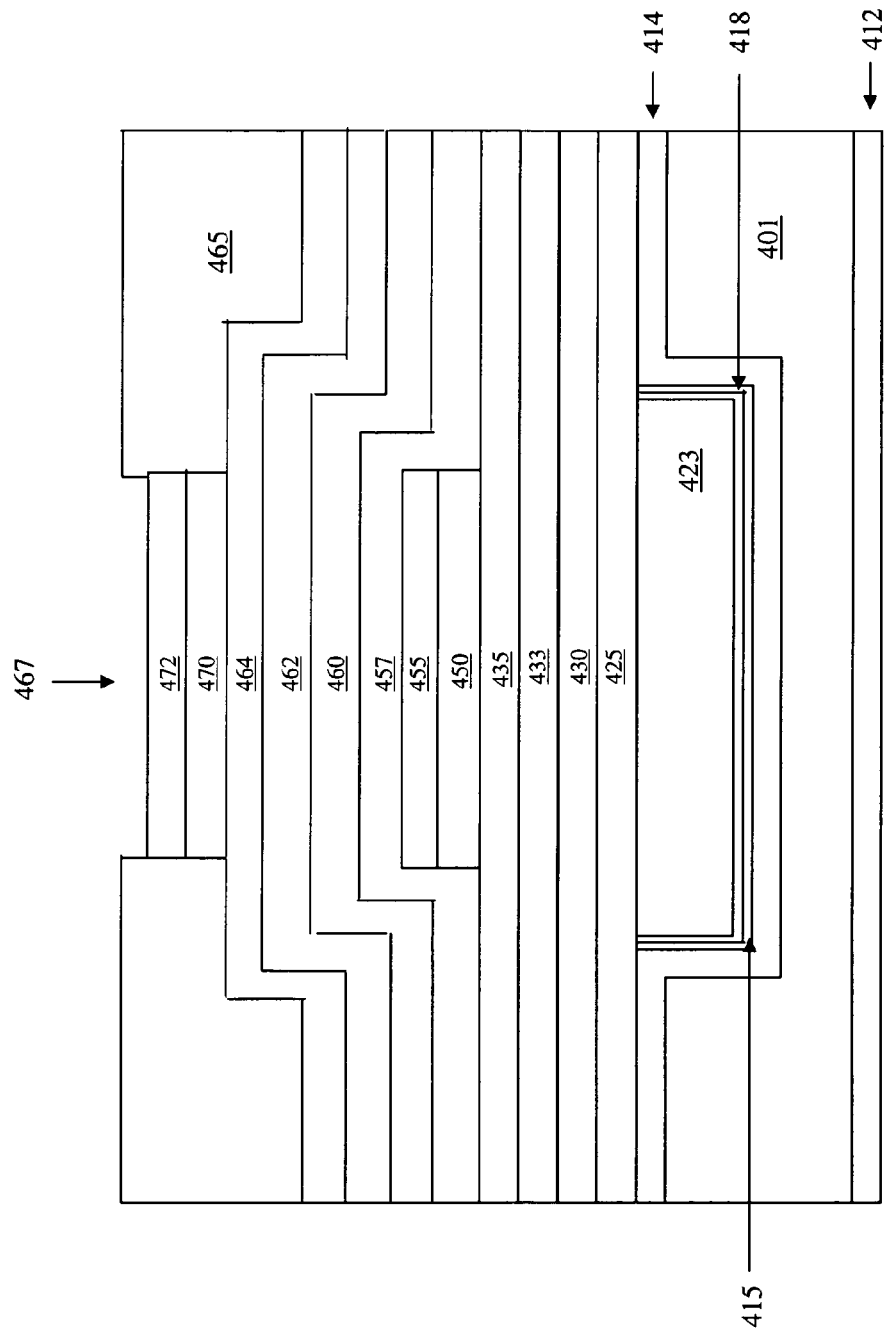
Figure 18:
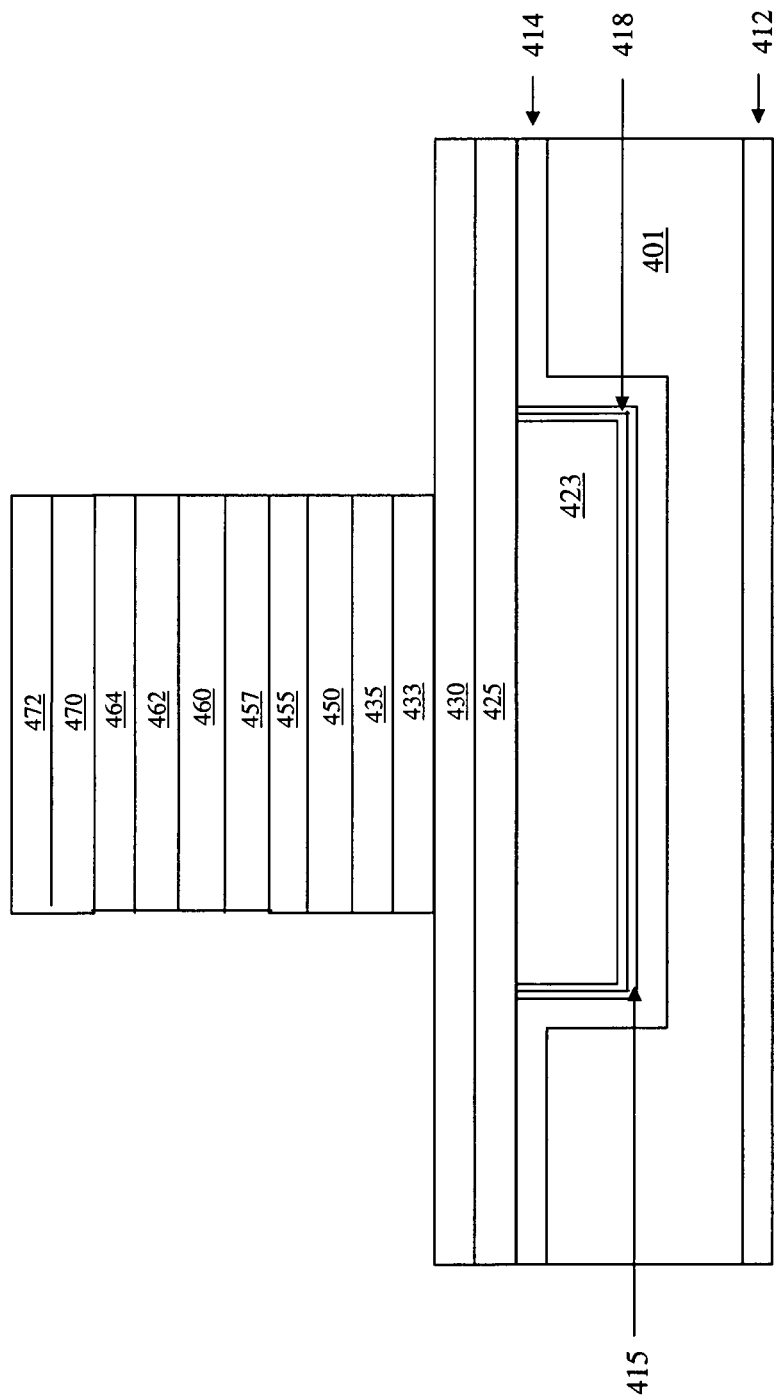

Turning now on FIGS. 17 and 18, a second magnetic core layer 470 of an iron-cobalt alloy is electroplated through the second photoresist aperture onto the third seed layer 464. In the illustrated embodiment, the thickness of the iron-cobalt alloy is about six μm. Following the electroplating process for the iron-cobalt alloy, the substrate is rinsed with carbon dioxide ("$CO_2$")-saturated, de-ionized water and immersed in an electrolyte (e.g., a nickel electrolyte) to form a second protective layer 472 (e.g., a thin nickel protective layer at about 250-300 Å) over the second magnetic core layer 470. With respect to FIG. 18, the fourth photoresist layer 465 is stripped off the top surface of the micromagnetic device using conventional photoresist stripping techniques. While the illustrated embodiment includes two magnetic core layers, it should be understood that the aforementioned process may be repeated any number of times to provide the desired number of magnetic core layers as dictated by a particular application.

Figure 19:
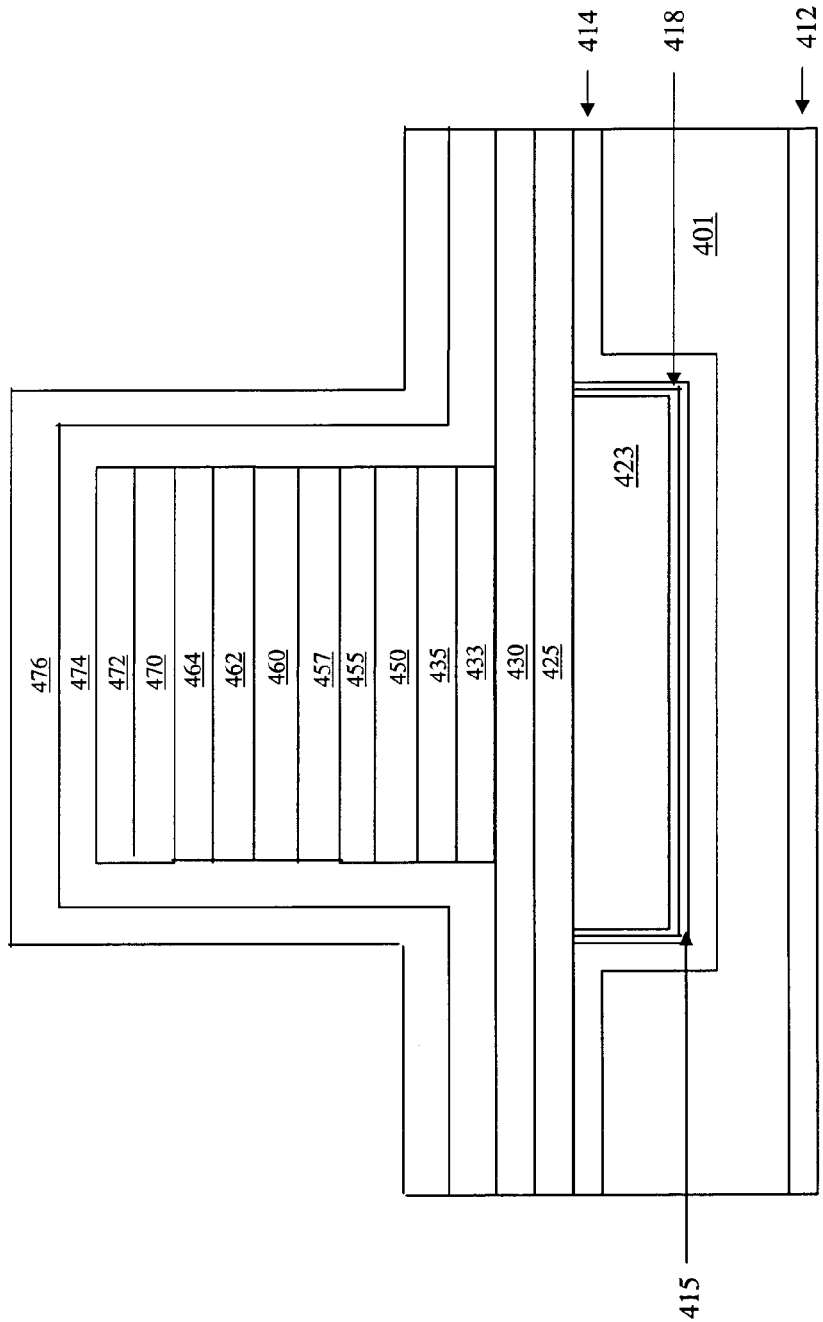

Turning now to FIG. 19, a sixth adhesive layer 474 (e.g., titanium or chromium at about 300 Å) is deposited by sputtering over the surface of the micromagnetic device. The sixth adhesive layer 474 is followed by sputter-deposition of a fifth insulating layer 476 over the top surface of the sixth adhesive layer 474 at approximately 5000 Å thick. The fifth insulating layer 476 includes aluminum oxide or silicon dioxide at about 500 Å, an insulation polymer, a photoresist, or polyimide. An alternative process for depositing a silicon dioxide or other insulating layer uses a chemical-vapor deposition process.

Thus, the first and second magnetic core layers 450, 470 are electroplated between the third and fifth insulating layers 430, 476. The iron-cobalt alloy magnetic core layers preferably alternate with layers of nickel, an adhesion layer, an insulation layer, a further adhesion layer, and a seed layer. An exemplary thickness of the iron-cobalt alloy layers is six μm, which is approximately one skin depth for a switching frequency of 10 MHz. The thickness of the iron-cobalt alloy layers is typically constrained to be relatively thin such as six μm to reduce core loss due to induced currents in these magnetically permeable and electrically conductive layers at the switching frequency of a power converter or other end product. In an exemplary design, six magnetic core layers are deposited with five interposed insulating layers, etc.

Figure 20:
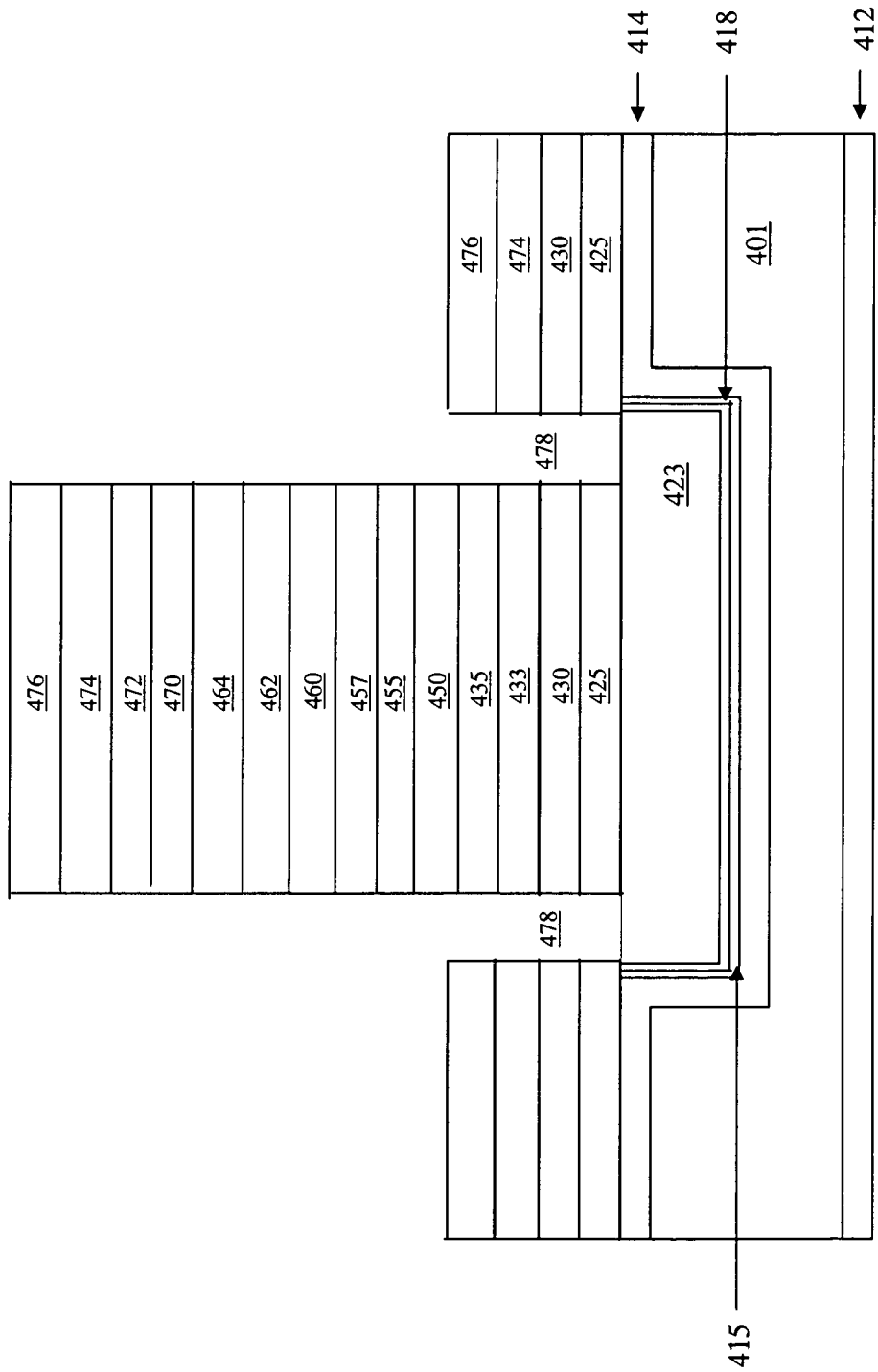

Turning now to FIG. 20, vias 478 are opened through the micromagnetic device to the first conductive winding layer 423. The vias 478 are formed by depositing a photoresist such as AZ4620, by AZ Electronic Materials USA Corp., Branchburg, N.J., by spinning, curing, patterning, and processing to expose apertures to down through the second adhesive layer 425 and the third insulating layer 430. The exposed portions of the micromagnetic device are then etched down to the first winding section 423 using a buffered oxide etch, which is typically a blend of 49% hydrofluoric acid ("HF") and 40% ammonium fluoride ("$NH_4F$") in various predetermined ratios, after cleaning the substrate with deionized water, using techniques well known in the art.

Figure 21:
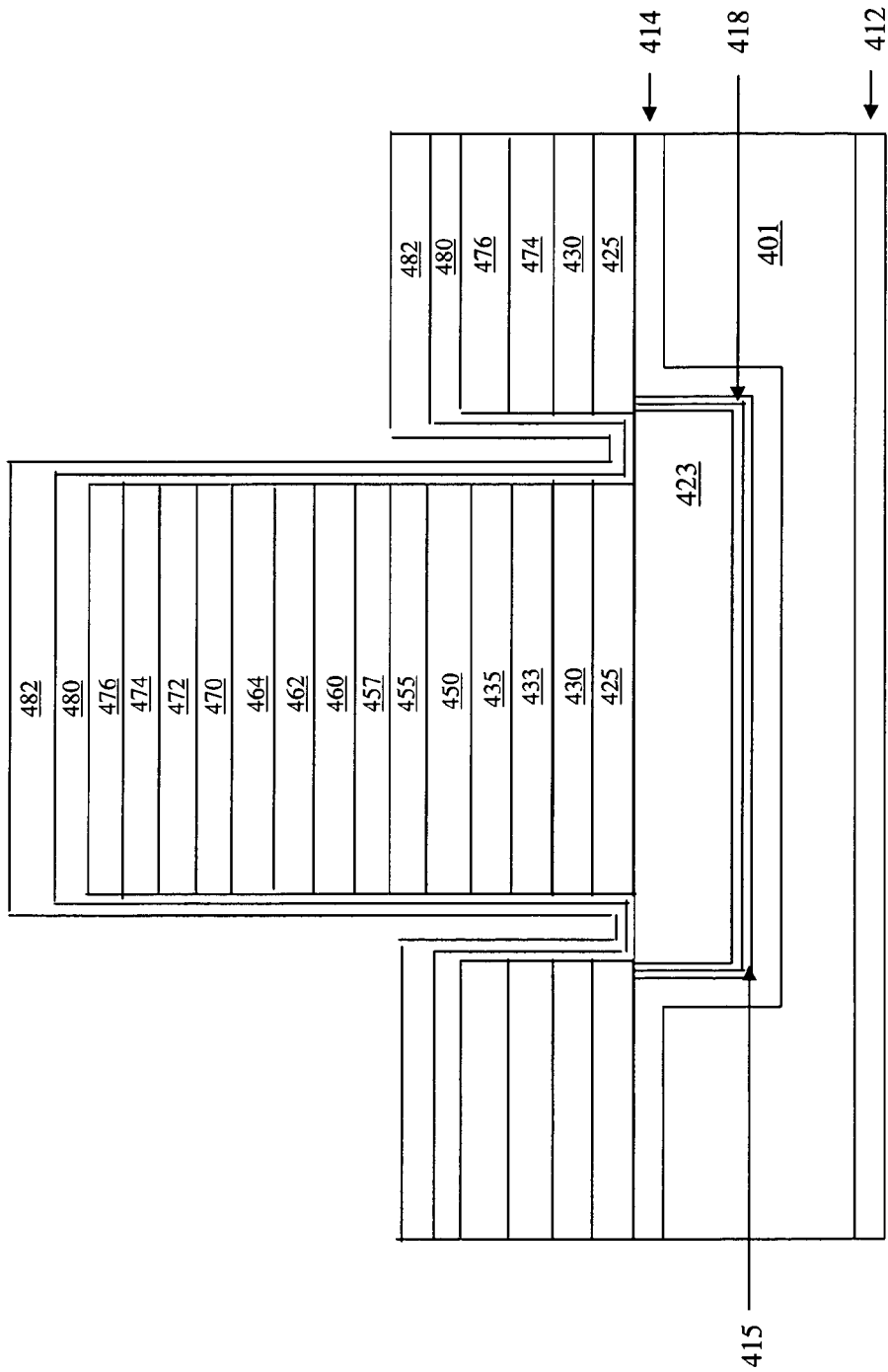

Turning now to FIG. 21, a seventh adhesive layer 480 (e.g., titanium or chromium) followed by a fourth seed layer 482 are deposited across the top surface of the micromagnetic device onto which a conductive layer thereof will be electrodeposited in a later processing step. The fourth seed layer 482 is formed by sequentially sputtering thin sublayers of gold (at about 500 Å) and/or copper (at about 2000 Å).

Figure 22:
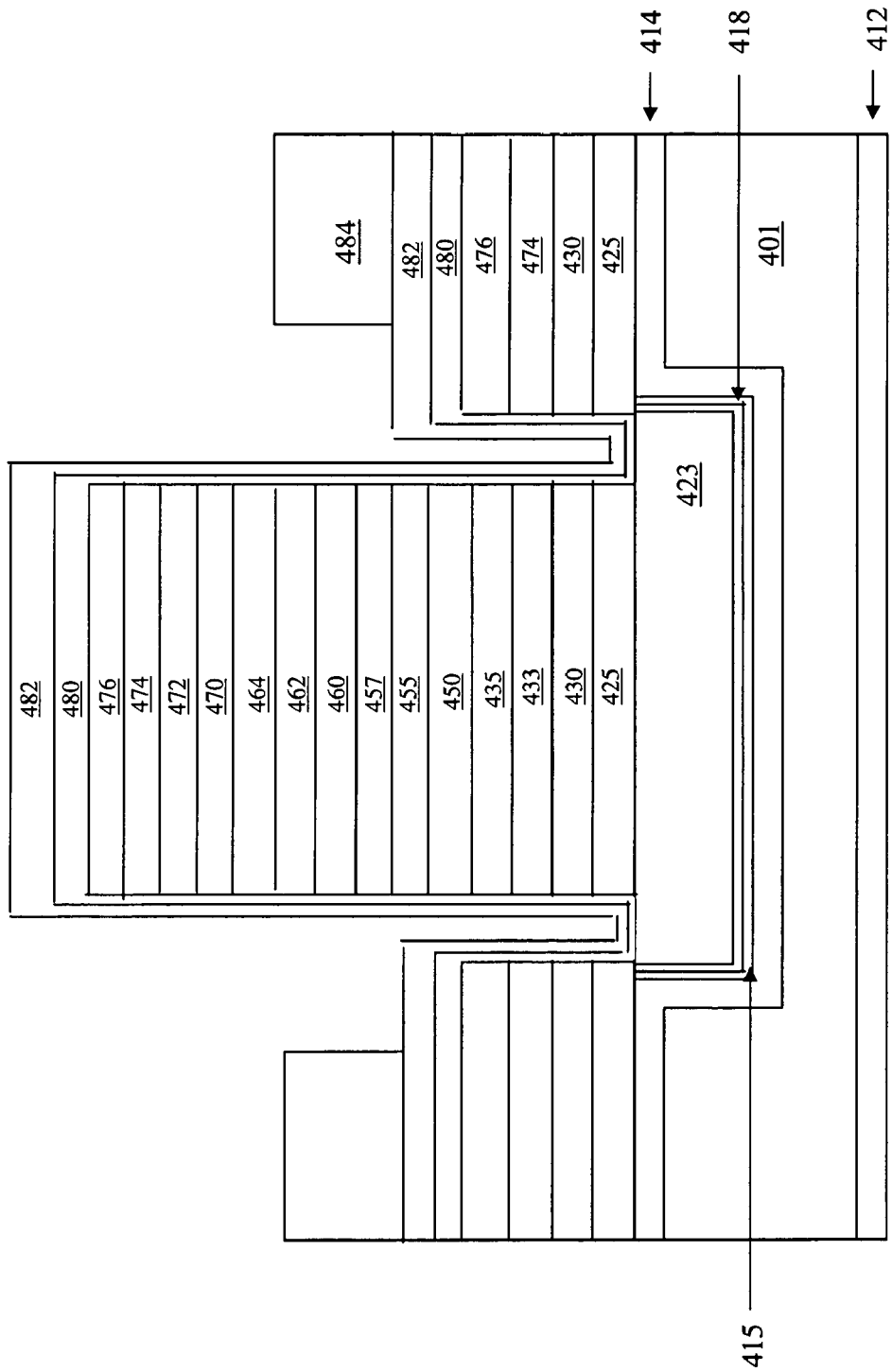

Turning now to FIG. 22, a fifth photoresist layer 484 is deposited above the fourth seed layer 482. The fifth photoresist layer 484 is spun on and patterned to form apertures for a conductive layer to be electrodeposited in a later processing step that forms a portion of a winding of the micromagnetic device. In the illustrated embodiment, the fifth photoresist layer 484 is AZ4620, by AZ Electronic Materials USA Corp., Branchburg, N.J. and is spun on and soft baked using a multi-spin/single exposure technique to produce a 50 μm thick photoresist film. The first spin is followed by a soft bake at 80° C. on a hot plate for approximately five minutes. Then a second layer of photoresist is spun on and a second bake at 120° C. for five minutes is performed to outgas solvents therefrom. Then an ultraviolet exposure and a developing step define the top conductive patterns in the fifth photoresist layer 484.

Figure 23:
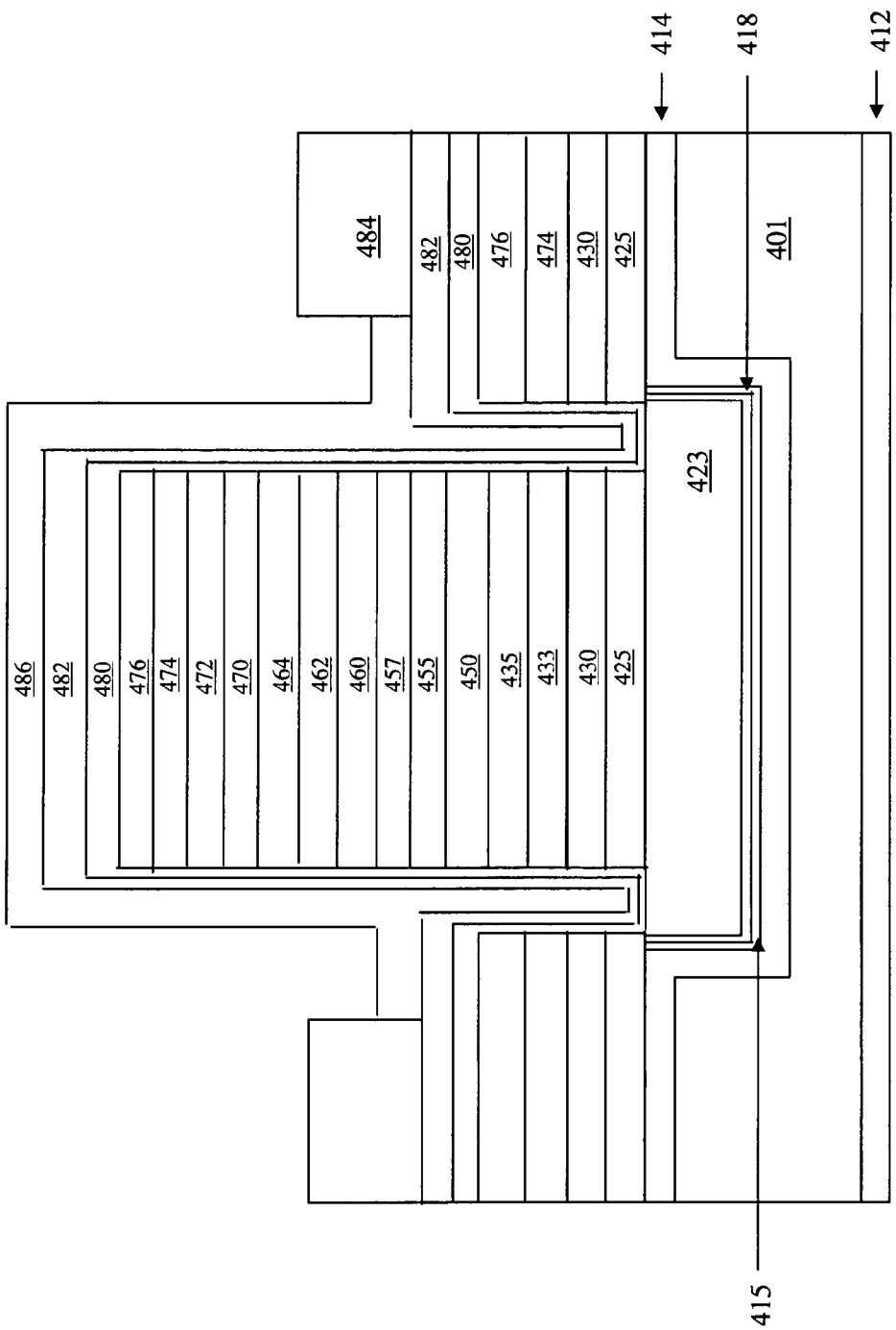

Turning now to FIG. 23, a second conductive winding layer 486 of the micromagnetic device is electrodeposited over the fourth seed layer 482 to form a second winding section. In an advantageous embodiment, the second winding section 486 is formed from copper. The electrodeposition process is preferably performed using an electrolyte as described below. The first and second winding sections form a winding for the micromagnetic device.

Figure 24:
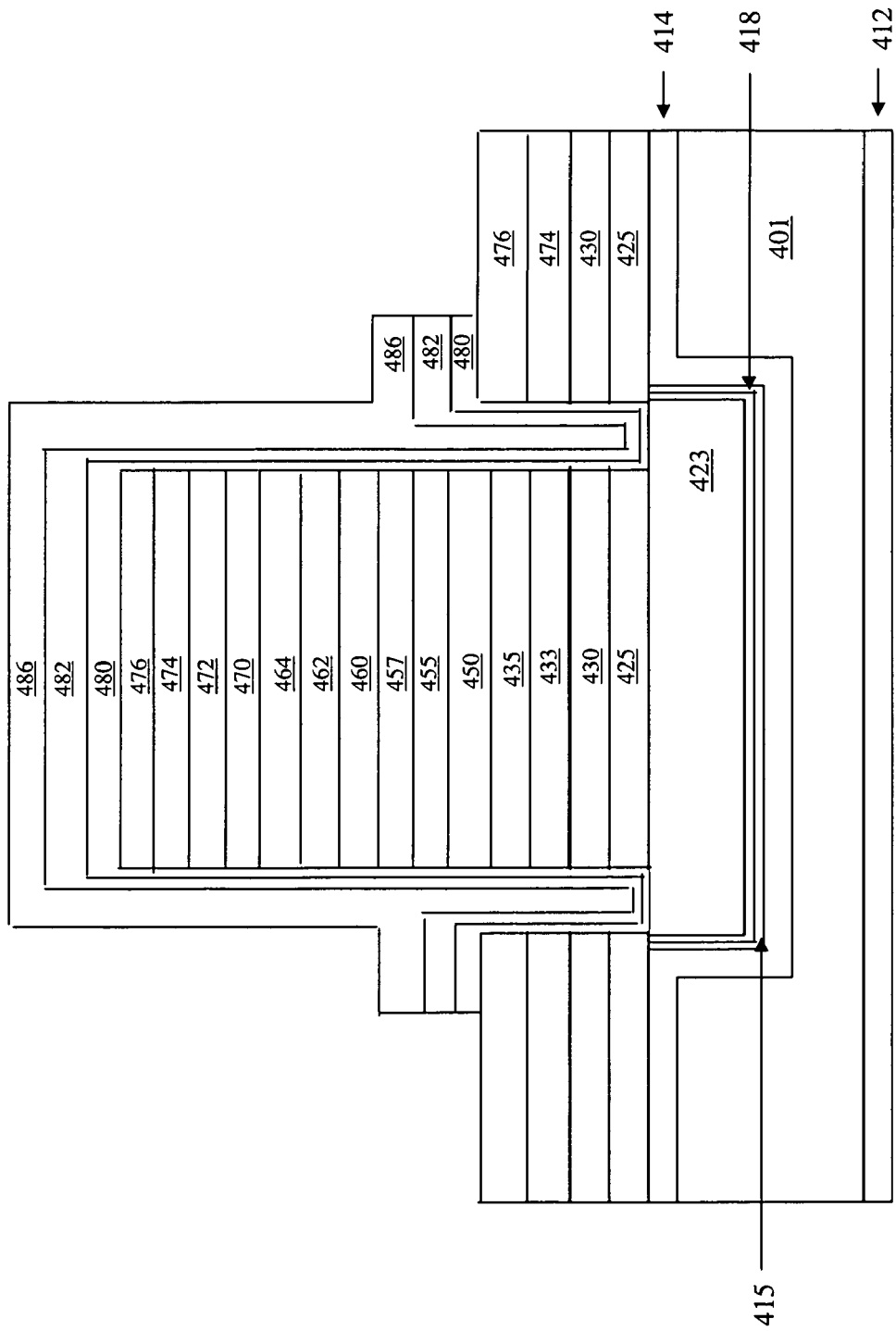

Turning now to FIG. 24, the fifth photoresist layer 484 is stripped off the top surface of the micromagnetic device using conventional photoresist stripping techniques, exposing portions of the fourth seed layer 482 previously covered by the fifth photoresist layer 484. Thereafter, exposed portions of the fourth seed layer 482 are removed via a sulfuric acid etch and exposed portions of the seventh adhesive layer 480 are removed via a hydrofluoric acid etch.

Figure 25:
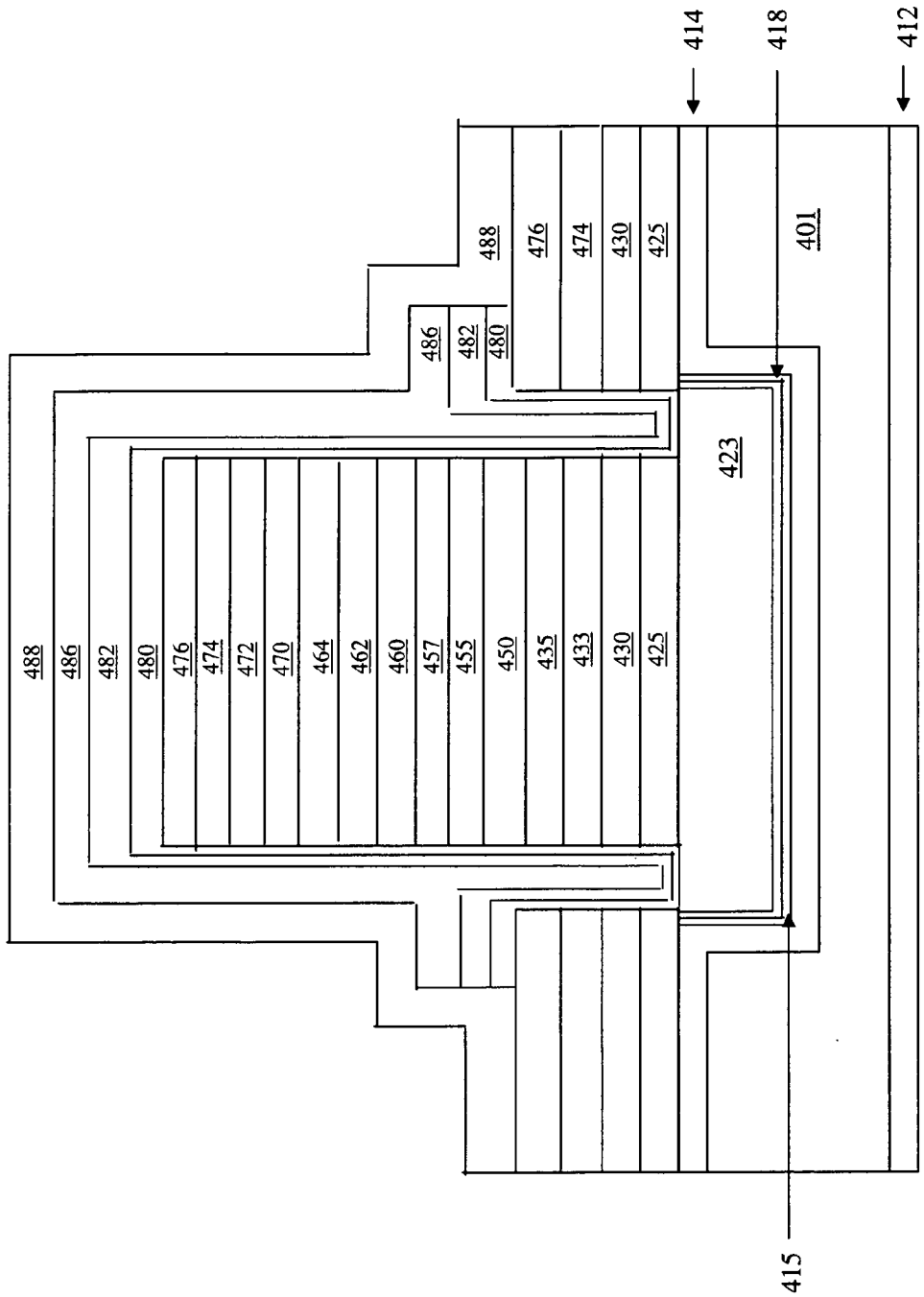

Turning now to FIG. 25, an eighth adhesive layer 488 of titanium is sputtered onto the top surface of the micromagnetic device at about 2000 Å. The eighth adhesive layer 488, after etching, will provide a mechanical base for a solder-ball capture in a later processing step.

Figure 26:
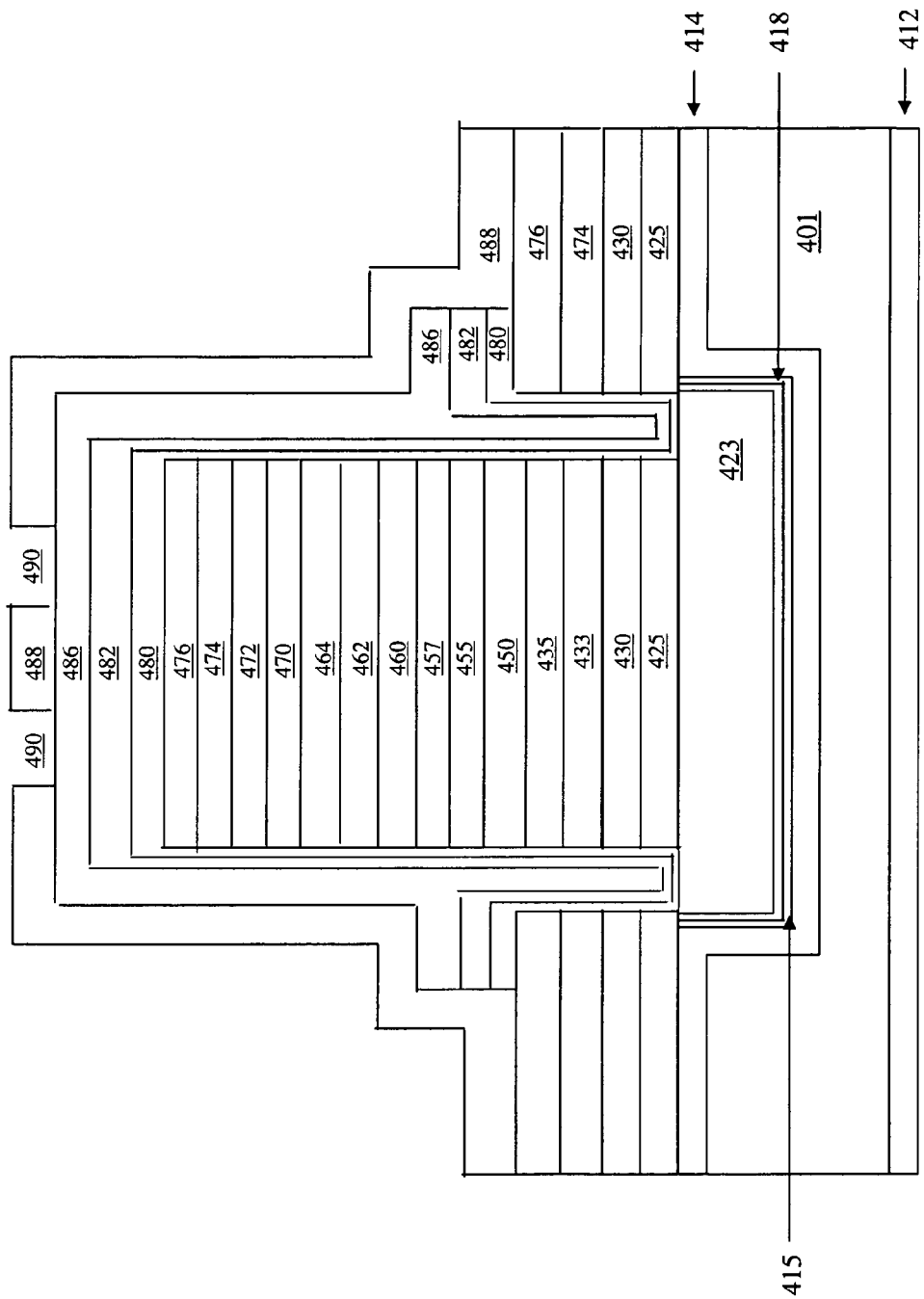

Turning now to FIG. 26, a photoresist layer (not shown) is deposited over the eighth adhesive layer 488. The photoresist layer is spun on and patterned using conventional processing techniques to expose portions of the eighth adhesive layer 488 that are then removed by etching to form apertures for solder balls or other interconnect to be deposited in a later processing step. In this exemplary embodiment, the photoresist layer is AZ4400 from AZ Electronic Materials USA Corp., Branchburg, N.J. After forming the apertures in the photoresist layer, the exposed portions of the underlying eighth adhesive layer 488 are etched down to the second winding section 486 using a hydrofluoric acid etch. The result is to produce apertures 490 for solder balls in the eighth adhesive layer 488.

Figure 27:
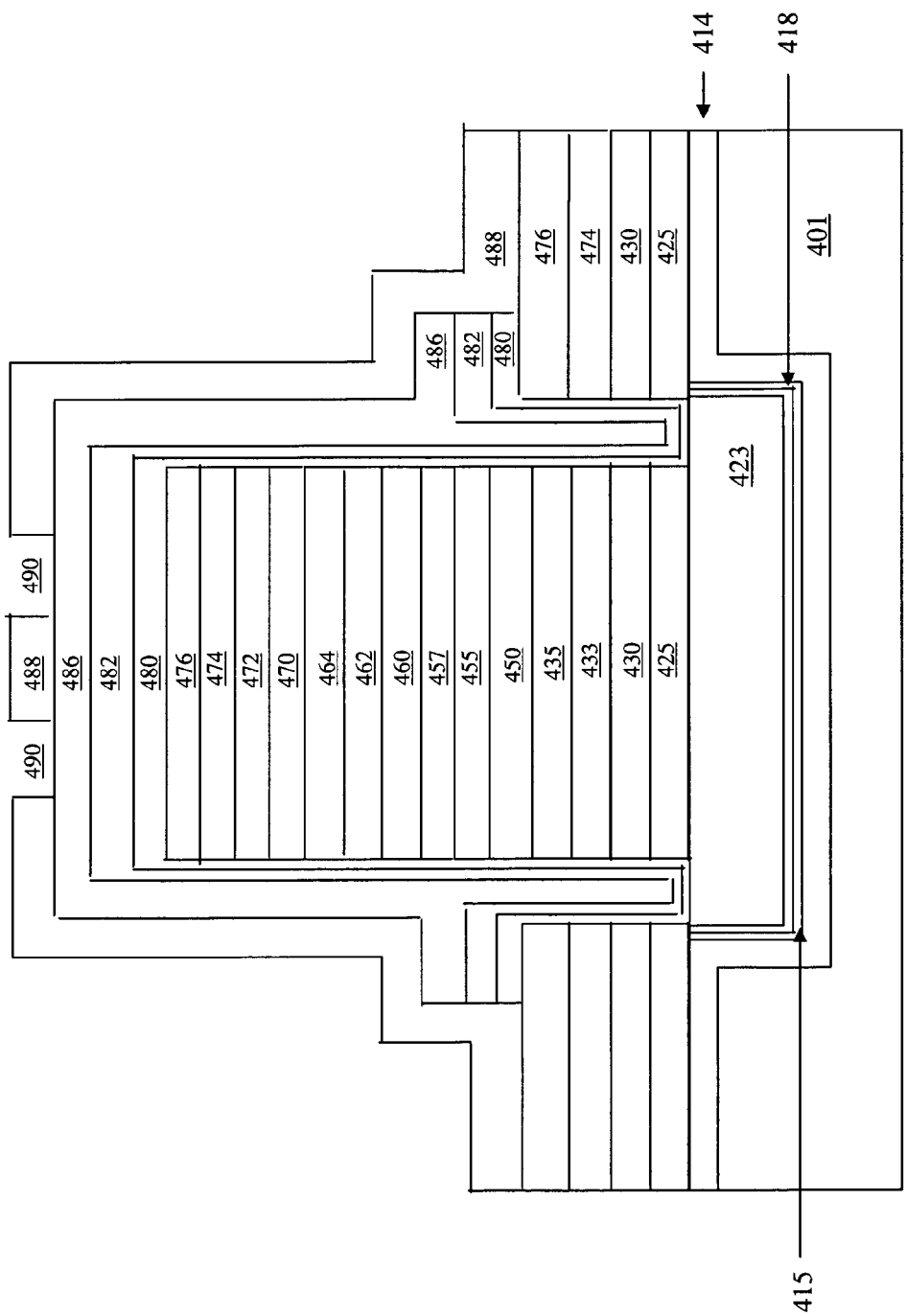

Turning now to FIG. 27, the first insulating layer 412 is removed by backgrinding, using techniques well understood in the art. The original thickness of the substrate 401 was about one mm, which is now ground down to approximately 200 µm to accommodate thinner packaging and improved heat transfer of the micromagnetic device. In the backgrinding process, the layer of silicon dioxide, which forms the first insulating layer 412, is removed with an adjoining portion of the substrate 401. The process of thinning the substrate 401 and removing the first insulating layer 412 is a stress-relieving step that accommodates and relieves a substantial portion of the strain that inherently results from previous processing steps that deposited the conductive and magnetic alloy structures for the micromagnetic device.

Figure 28:
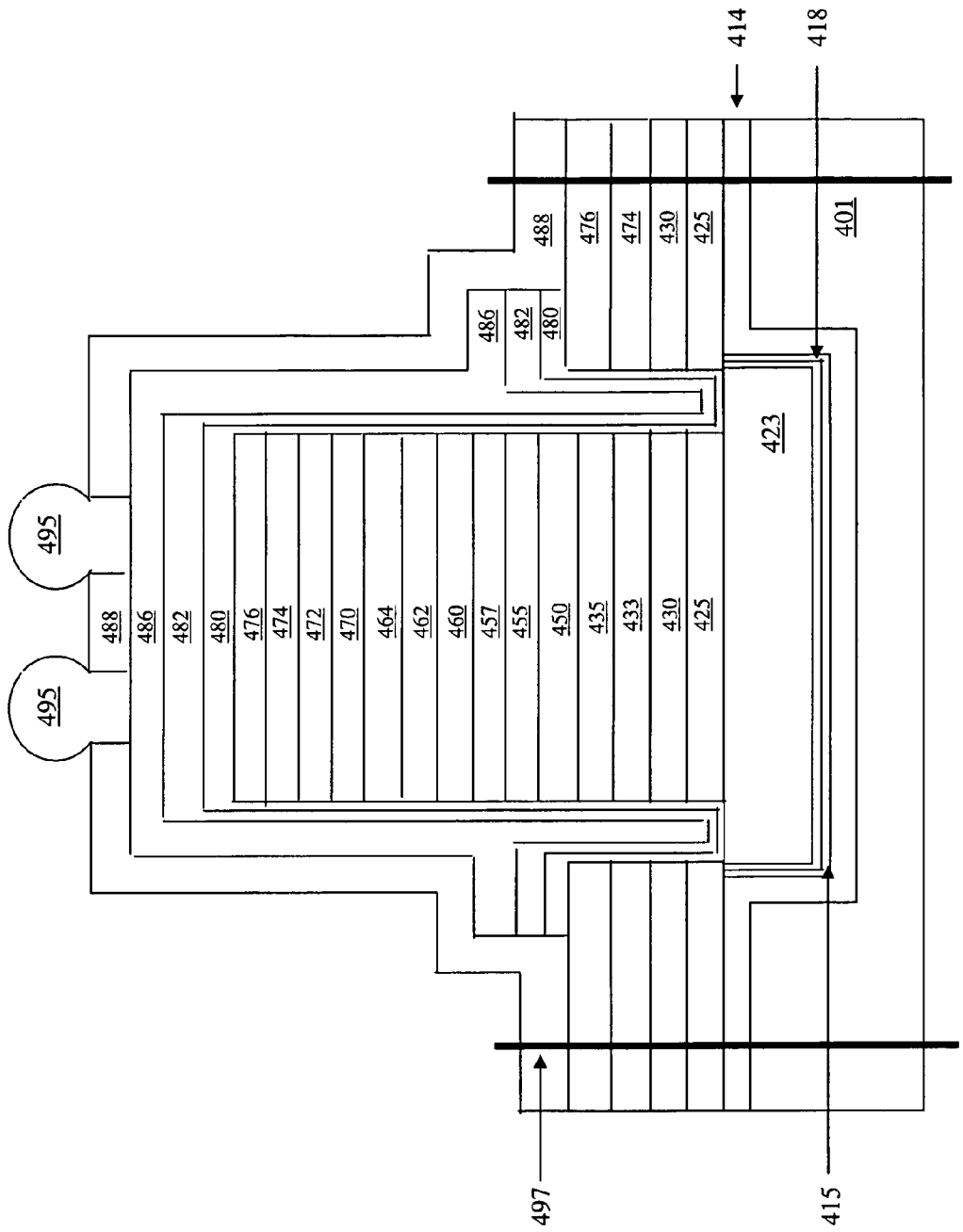

Turning now to FIG. 28, interconnects 495 (e.g., solder balls) for later interconnection of the micromagnetic device to external circuitry are dropped into the apertures 490 that were formed in the eighth adhesive layer 488. In an advantageous embodiment, the solder balls 495 are lead-free. The solder balls 495 may be placed by positioning a mask on the top surface of the micromagnetic device. The mask is formed with appropriately sized and located apertures that are above the desired solder-ball locations. A quantity of solder balls 495 is poured onto the mask, and the assembly is shaken to cause the solder balls 495 to drop into the mask apertures. The remaining solder balls 495 are poured off. In an alternative process, solder balls 495 may be placed using a placing mechanism employing a vacuum-operated ball-placing tool. As a further alternative for later interconnection of the micromagnetic device, a solder layer can be deposited into the apertures 490 formed in the eighth adhesive layer 488 using an electroplating process. FIG. 28 also illustrates sawing lines (e.g., sawing line location 497) for die singulation as necessary.

Figure 29:
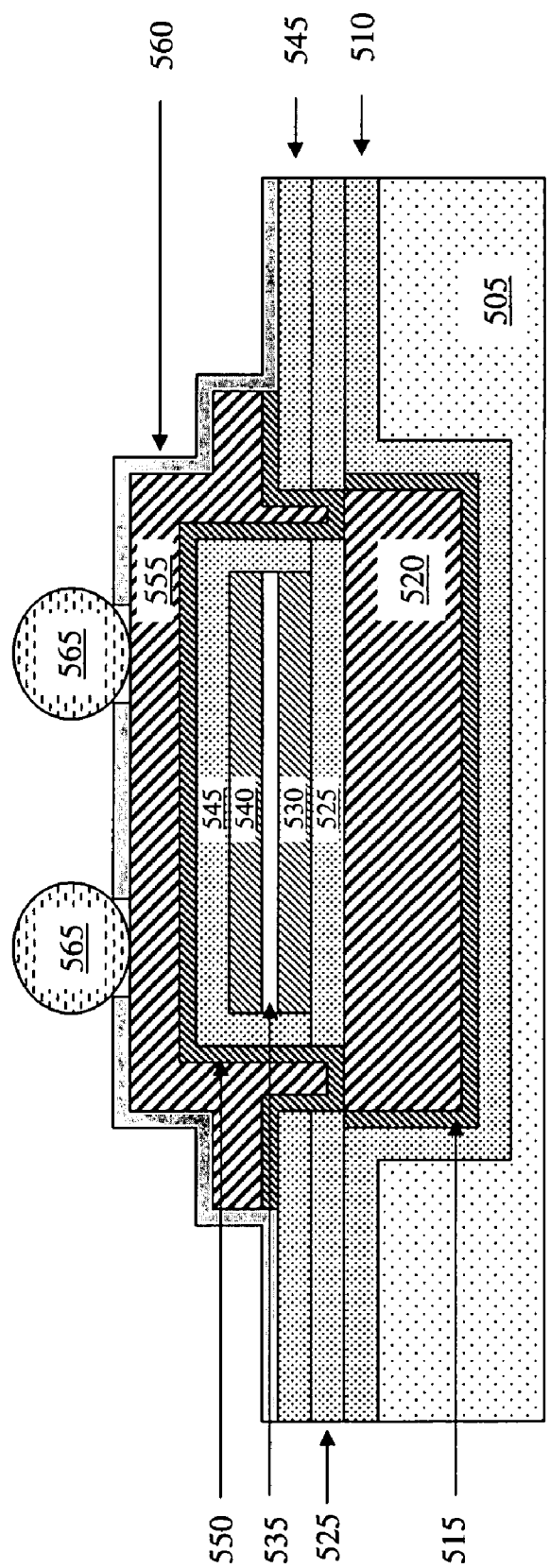
FIG. 29 illustrates a cross sectional view of an embodiment of a micromagnetic device constructed according to the principles of the present invention.

Turning now to FIG. 29, illustrated is a cross sectional view of an embodiment of a micromagnetic device constructed according to the principles of the present invention. In the present embodiment, some layers have been omitted or combined into a single layer for purposes of illustration. The micromagnetic device is formed on a substrate 505 (e.g., silicon) and includes a first insulating layer 510 (e.g., silicon dioxide) formed thereover. Following an electroplating process to form a trench in a center region of the substrate 505, an adhesive layer (e.g., titanium or chromium) and a first seed layer 515 (e.g., gold or copper) are formed over the first insulating layer 510. Additionally, a first conductive winding layer 520 of, without limitation, copper, is formed in the trench that forms a first section of a winding for the micromagnetic device.

An adhesive layer (e.g., titanium or chromium) and a second insulating layer 525 (e.g., silicon dioxide) is formed above the first conductive winding layer 520. The micromagnetic device also includes first and second magnetic core layers 530, 540 with a third insulating layer 535 therebetween in a center region of the substrate 505 above the first conductive winding layer 520. The first and second magnetic core layers 530, 540 are typically surrounded by an adhesive layer, seed layer and protection layer as set forth below with respect to FIG. 31. Also, an adhesive layer may be formed prior to forming the third insulating layer 535.

An adhesive layer (e.g., titanium or chromium) and a fourth insulating layer 545 (e.g., silicon dioxide) are formed above the second magnetic core layer 540 in the center region of the substrate 505 and over the second insulating layer 525 laterally beyond the center region of the substrate 505. An adhesive layer (e.g., titanium or chromium) and a second seed layer 550 (e.g., gold or copper) are formed above the fourth insulating layer 545 in the center region of the substrate 505 and in vias down to the first conductive winding layer 520 about the center region of the substrate 505. A second conductive winding layer 555 is formed above the second seed layer 550 and in the vias to the first conductive winding layer 520. The second conductive winding layer 555 is formed of, without limitation, copper and forms a second section of a winding for the micromagnetic device. Thus, the first conductive winding layer 520 and the second conductive winding layer 555 form the winding for the micromagnetic device.

An adhesive layer 560 (e.g., titanium) is formed above the second conductive winding layer 555 in the center region of the substrate 505 and over the fourth insulating layer 545 laterally beyond the center region of the substrate 505. Solder balls 565 are formed in apertures in the adhesive layer 560.

Figure 30:
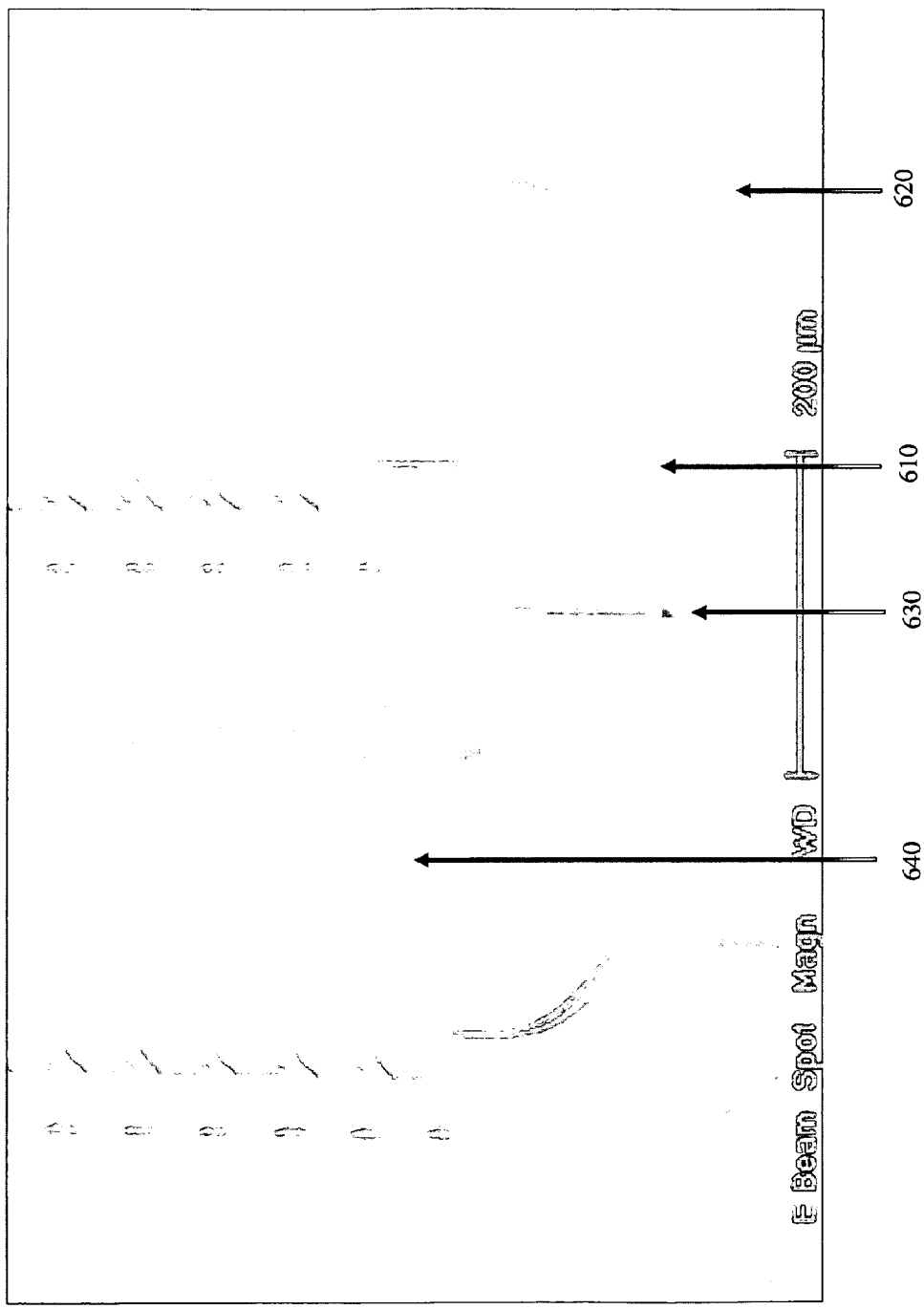
FIG. 30 illustrates a scanning electron microscope view of a micromagnetic device constructed according to the principles of the present invention.

Turning now to FIG. 30, illustrated is a scanning electron microscope view of a micromagnetic device (e.g., an inductor) constructed according to the principles of the invention. The inductor is formed with a layered magnetic core 610 on a silicon substrate 620. An air gap 630 of length 10 µm between the magnetic core sections is visible in the microphotograph. A copper conductive winding 640 is formed around the layered magnetic core 610. A 200 µm scale is visible in the lower portion of the microphotograph to provide a reference for feature sizes. Although the formation of a micromagnetic device has been described herein using an iron-cobalt alloy, in an advantageous embodiment, the micromagnetic device employs other materials such as an iron-cobalt-phosphorus alloy as described below.

Figure 31:
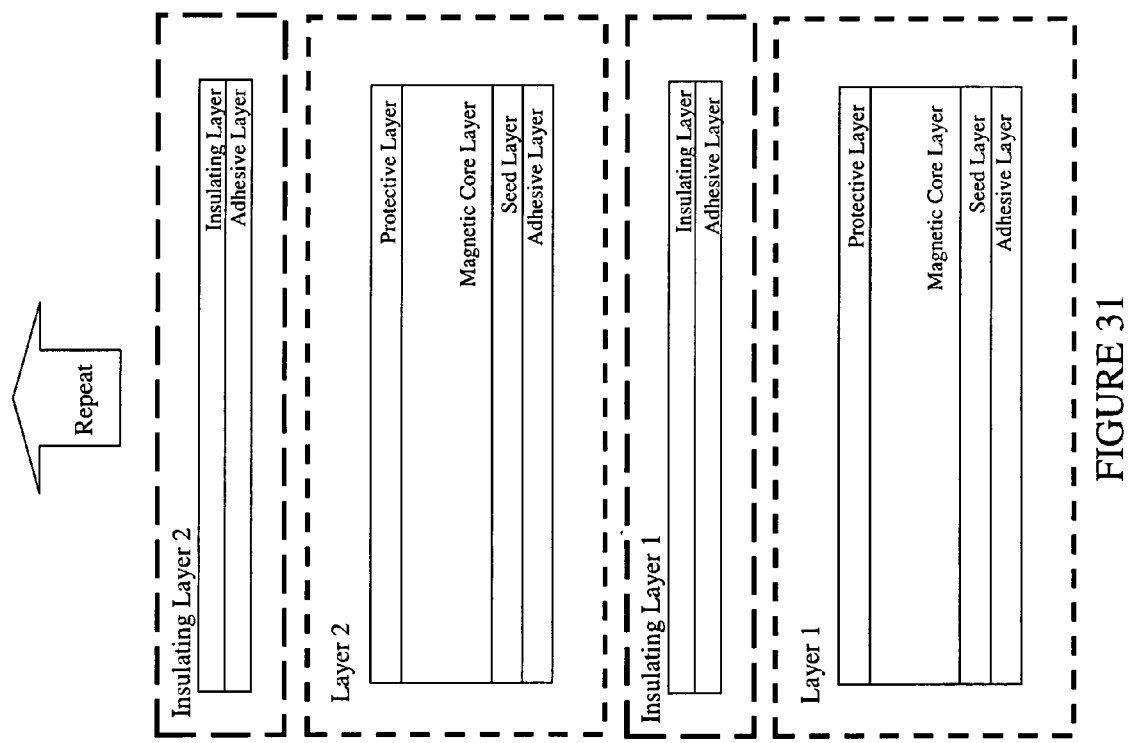
FIG. 31 illustrates a partial cross-sectional view of magnetic core layers of a magnetic core of a micromagnetic device constructed according to the principles of the present invention.

Turing now to FIG. 31, illustrated is a partial cross-sectional view of magnetic core layers of a magnetic core of a micromagnetic device constructed according to the principles of the present invention. As mentioned above, while the present embodiment illustrates two magnetic core layers, the principles of the present invention are not so limited. The first and second magnetic core layers (designated "Layer 1" and "Layer 2") include an adhesion layer (designated "Adhesive Layer") of, without limitation, titanium or chromium and a seed layer (designed "Seed Layer") of, without limitation, gold or copper. The first and second magnetic core layers also include a magnetic core layer (designated "Magnetic Core Layer") of, without limitation, an iron-cobalt-phosphorus alloy and a protective layer (designated "Protective Layer") of, without limitation, nickel. First and second insulating layers (designated "Insulating Layer 1" and "Insulating Layer 2") include an adhesion layer (designated "Adhesive Layer") of, without limitation, titanium or chromium and an insulting layer (designated "Insulating Layer") of, without limitation, silicon dioxide or aluminum oxide. The sequence of magnetic core layers insulation layers can be repeated as needed to form the desired number of magnetic core layers.

Thus, a sequence of steps has been introduced for forming a micromagnetic device with improved magnetic characteristics using processes that readily accommodate high-volume production. Although the exemplary device that was described with reference to FIG. 4, et seq., is an inductor, straightforward alterations to the process can be readily made by one with ordinary skill in the art to form a transformer with dielectrically isolated windings.

In an exemplary embodiment, the micromagnetic device is formed on a substrate and includes a first insulating layer (e.g., silicon dioxide) formed above the substrate (e.g., silicon), and a first seed layer (e.g., gold or copper) formed above the first insulating layer. The micromagnetic device also includes a first conductive winding layer (e.g., gold) selectively formed above the first seed layer, a second insulating layer (e.g., silicon dioxide) formed above the first conductive winding layer, and a first magnetic core layer (e.g., iron-cobalt alloy or an iron-cobalt-phosphorus alloy) formed above the second insulating layer. Thereabove, the micromagnetic device includes a second magnetic core layer (e.g., iron-cobalt alloy or an iron-cobalt-phosphorus alloy) formed between third and fourth insulating layers (e.g., aluminum oxide, silicon dioxide, insulation polymer, photoresist or polyimide). The micromagnetic device further includes a second seed layer (e.g., sublayers of gold and copper) formed above the fourth insulating layer, and a second conductive winding layer (e.g., gold) formed above the second seed layer and in vias to the first conductive winding layer. The first conductive winding layer and the second conductive winding layer form a winding for the micromagnetic device. In an advantageous embodiment, a protective layer (e.g., nickel) may be formed above the first and second magnetic core layers. Additionally, an interconnect (e.g., solder balls) may be formed in an aperture of an adhesive layer formed above the second conductive winding layer. Having introduced an exemplary micromagnetic device, method of forming the same and a power converter employing the same, we will now turn our attention to an electroplating tool and electrolyte employable for constructing the micromagnetic device.

Regarding the magnetic core layers, to provide an alloy with magnetic properties improved over alloys currently available, a ternary alloy including iron, cobalt, and phosphorous is introduced. The iron-cobalt-phosphorous ("FeCoP") alloy includes cobalt in the range of 1.8-4.5 atomic percent (e.g., preferably 2.5 percent), phosphorus in the range of 20.1-30 atomic percent (e.g., preferably 22 percent), and iron including substantially the remaining proportion. The alloy preferably includes trace amounts of sulfur, vanadium, tungsten, copper, and/or combinations thereof, with a concentration of each in the range of 1 to 100 parts per million ("ppm"), to reduce stress and/or increase resistivity compared to the basic ternary alloy without these trace elements. In the past, iron-cobalt-phosphorous alloys used higher proportions of cobalt (e.g., 5-15 atomic percent), and lower proportions of phosphorous (e.g., 13-20 atomic percent), which do not provide the advantageous high-frequency magnetic characteristics and other properties as described herein.

An iron-cobalt-phosphorous alloy employable with the magnetic core layers of FIG. 4, et seq., advantageously sustains a magnetic saturation flux density of about 1.5-1.7 tesla (15,000-17,000 gauss), and accommodates a power converter switching frequency of, without limitation, 10 MHz with low loss when electroplated in layers four μm thick, each layer separated by a thin insulation layer (e.g., aluminum oxide and/or silicon dioxide). In comparison, soft ferrites of the past commonly used in the design of switch-mode power converters typically sustain a magnetic saturation flux density of only about 0.3 tesla. The iron-cobalt-phosphorous alloy described herein is readily adaptable to a repeatable and continuing manufacturing process, and can provide long operational life in a typical application environment without substantial degradation of operating characteristics. The iron-cobalt-phosphorous alloy can be electroplated with a sufficiently high current density to accommodate a low-cost manufacturing operation. The iron-cobalt-phosphorous alloy can be readily electroplated in alternating layers with intervening insulating layers onto a surface patterned, such as with a photoresist, to produce a micromagnetic device operable at a high switching frequency with a low level of power dissipation.

Thus, a micromagnetic device formed with a ternary alloy with magnetic properties improved over those currently available, and related method, have been introduced herein formed over a substrate (e.g., silicon, glass, ceramic). In an advantageous embodiment, the new ternary alloy includes iron, cobalt and phosphorous and the magnetic alloy is an amorphous or nanocrystalline magnetic alloy.

In one embodiment, the micromagnetic device includes a substrate and a magnetic core layer formed over the substrate from a magnetic alloy. The micromagnetic device also includes an insulating layer formed over the magnetic core layer and another magnetic core layer formed over the insulating layer from a magnetic alloy. At least one of the magnetic alloys include iron, cobalt and phosphorous and a content of said cobalt is in the range of 1.8 to 4.5 atomic percent, a content of said phosphorus is in the range of 20.1 to 30 atomic percent, and a content of said iron is substantially a remaining proportion of said at least one of said magnetic alloys.

Figure 32:
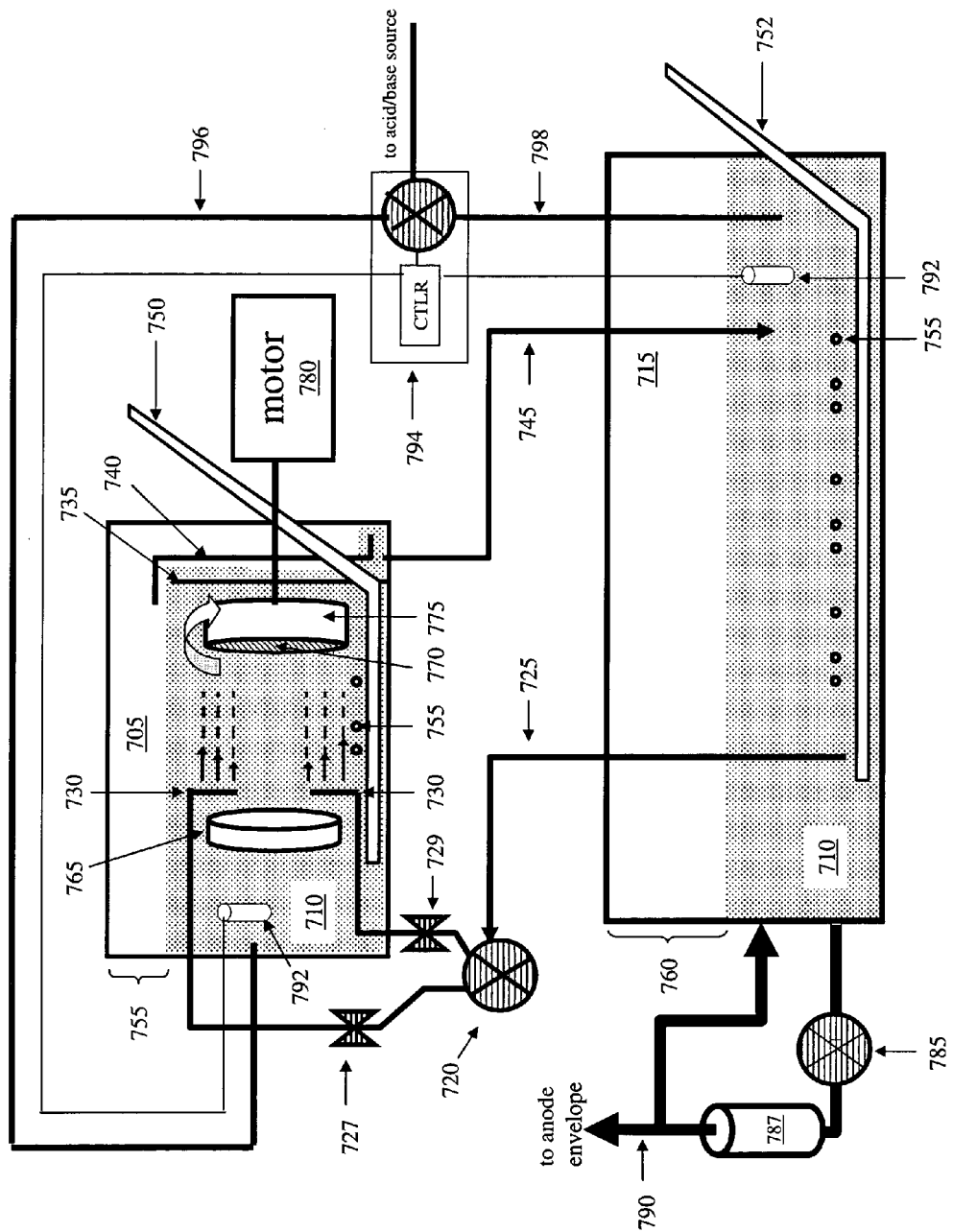
FIG. 32 illustrates an elevational view of an embodiment of an electroplating tool constructed according to the principles of the present invention.

Turning now to FIG. 32, illustrated is an elevational view of an embodiment of an electroplating tool constructed according to the principles of the invention. An electrolyte employable in the electroplating tool is adaptable for the deposition of a magnetic alloy including ones of iron, cobalt and phosphorus with advantageous magnetic properties as described below. The electroplating tool includes an electroplating cell 705 supplied with an electrolyte 710 from a reservoir 715. The reservoir 715 contains the electrolyte 710 with chemical composition including phosphorous as described below. In the embodiment represented in FIG. 32, the combined volume of the electrolyte 710 in the electroplating cell 705 and the reservoir 715 is approximately 90 liters. The electrolyte 710 is pumped by a first circulating pump 720 from the reservoir 715 through a first tube 725 to the electroplating cell 705, the flow of which is adjusted or regulated by first and second valves 727, 729. The electrolyte 710 supplied by the first circulating pump 720 flows through nozzles 730 into the electroplating cell 705 at a high flow rate to provide electrolyte agitation for electroplating uniformity. In an advantageous embodiment wherein a wafer (e.g., a six inch silicon wafer) is electroplated with a magnetic alloy, the flow rate of electrolyte 710 through apertures in the nozzles 730 is adjusted to approximately 120 liters per minute. The height of the electrolyte 710 in the electroplating cell 705 is controlled by a partition 735 over which excess electrolyte 710 flows behind a wall 740, and is returned to the reservoir 715 through a second tube 745.

The electrolyte 710 supplied to the electroplating cell 705 from the reservoir 715 through the first and second valves 727, 729 is dispersed through the electrolyte 710 already contained within the electroplating cell 705 through the nozzles 730. In an advantageous embodiment, the nozzles 730 include apertures (e.g., apertures similar to apertures in an ordinary bathroom shower head) angularly disposed in six lines of apertures oriented 60° apart.

Although the reservoir 715 and the electroplating cell 705 are fitted with covers that can be opened to provide interior access, the reservoir 715 and the electroplating cell 705 are typically closed and substantially sealed to the outside atmosphere during an electroplating process. Lying in a lower position in the electroplating cell 705 and in reservoir 715 are first and second porous tubes 750, 752, respectively, through which an inert gas (e.g., nitrogen) flows from an inert gas source (e.g., a nitrogen source) during an electroplating operation. Small bubbles 755 (e.g., bubbles of nitrogen) are formed on the outer surface areas of the first and second porous tubes 750, 752 and are dispersed throughout the electrolyte 710 in each container. Oxygen in upper portions 755, 760, respectively, of the electroplating cell 705 and the reservoir 715 is thereby exhausted to the outside atmosphere. By this means, the electrolyte 710 in the electroplating cell 705 and the reservoir 715 becomes substantially oxygen free, sustaining a dissolved oxygen level less than ten ppb during an electroplating operation.

An anode 765 immersed for the electroplating process in the electrolyte 710 is advantageously formed with an alloy of about four atomic percent cobalt and 96 atomic percent iron. A wafer or substrate 770 onto which the magnetic alloy is electroplated, is mounted on a magnet 775 which is rotated at a rotational rate, such as 100 revolutions per minute ("rpm"), by a motor 780. Rotation of the wafer 770 during the electroplating process advantageously provides uniformity of coverage of the electroplated alloy thereon. The magnet 775 provides a magnetic field of approximately 1000-2000 gauss to orient the easy axis of magnetization of the electroplated material, forming thereby a magnetically anisotropic layer. The magnet 775 in the representation illustrated in FIG. 32 includes a rare earth permanent magnet. In an alternative advantageous arrangement, the magnet 775 includes a current-carrying coil.

To maintain cleanliness during the electroplating process of the electrolyte 710 contained in the electroplating cell 705 and in the reservoir 715, the electrolyte 710 in the reservoir 715 is recirculated by a second circulating pump 785 through a microporous filter 787. In an advantageous arrangement, the microporous filter 787 is a 0.2 μm filter or better. To further maintain electrolyte 710 cleanliness during the electroplating process, metallic and other microscopic particles that slough off the anode 765 are captured by encasing the anode 765 within an envelope of a semipermeable membrane (see below). The filtered electrolyte 710 from the microporous filter 787 flows into the electroplating cell 705 and reservoir 715 through a third tube 790. Additionally, the proper pH is maintained by including pH-sensing electrode(s) 792 in the electroplating cell 705 and/or the reservoir 715 and adding acid, for example, 12% perchloric acid ("HClO$_4$"), or base, as needed, with a metering pump control assembly 794 (e.g., including a controller and a meter pump such as an Replenisher Model REPL50-5-B by Ivek Corporation of North Springfield, Vt.) to the electroplating cell 705 (via a fourth tube 796) and/or the reservoir 715 (via a fifth tube 798) when the sensed pH rises above a threshold level.

Figure 33:
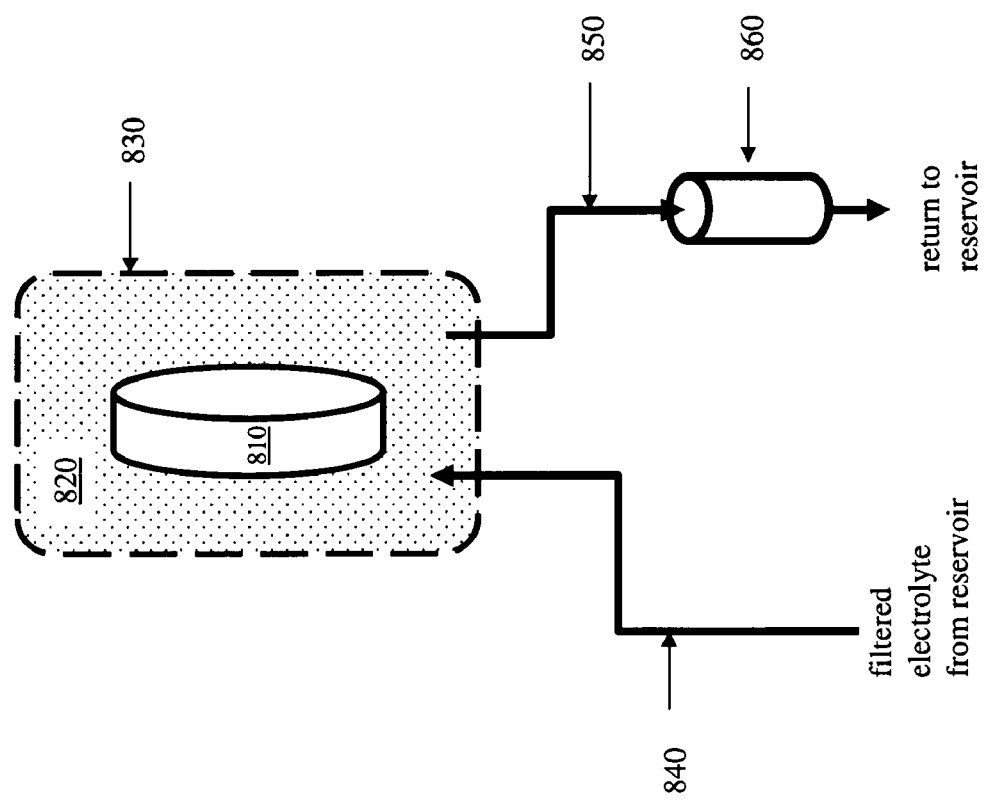
FIG. 33 illustrates a diagram of a portion of an embodiment of an electroplating tool constructed according to the principles of the present invention.

Turning now to FIG. 33, illustrated is a diagram of a portion of an embodiment of an electroplating tool constructed according to the principles of the present invention. The present embodiment illustrates an anode 810 immersed in an electrolyte 820 and contained within semipermeable membrane 830 in accordance with an electroplating tool constructed according to the principles of the invention. The filtered electrolyte 820 from a microporous filter (see FIG. 32) flows into the volume contained by the semipermeable membrane 830 through a first tube 840 and is returned filtered to a reservoir (see FIG. 32) through a second tube 850 and filter 860. In an advantageous embodiment, the filter 860 includes a 0.2 μm filter or better. The cleanliness of electrolyte 820 in close proximity to a wafer (see FIG. 32) during a continued electroplating operation is thereby preserved.

Several characteristics of the electroplating process are advantageously employed to form a uniformly electroplated layer of a magnetic alloy such as iron-cobalt-phosphorous alloy onto a surface of a wafer. First, a sufficiently high flow rate of the electrolyte is provided through apertures in the nozzles to provide agitation of the electrolyte in the electroplating cell (e.g., 120 liters per minute for a six inch wafer) such as by using a circulating pump (e.g., Baldor Model CL 3506 pump by Baldor Electric Company of Fort Smith, Ark.). Second, the wafer is rotated (e.g., at 100 rpm) with a Leeson Model 985-616 D motor drive and a Leeson Speedmaster Controller Model 1740102.00 by Leeson Electric Corporation of Grafton, Wis., onto which the electrolyte is electroplated to provide uniformity of electroplating coverage. Third, a sufficiently low level of dissolved oxygen in the electrolyte is maintained to prevent oxidation of metallic species and other oxidizable electrolyte components. A mechanism to maintain a low level of dissolved oxygen is the bubbling of nitrogen (or other gas inert to chemical species in the electroplating process) through the electrolyte to drive out residual dissolved oxygen. The dissolved oxygen level can be monitored with a dissolved oxygen sensor, a monitoring process well known in the art, and the electroplating process can be interrupted when the dissolved oxygen level exceeds, for example, 10 parts per billion ("ppb"). Fourth, the pH level of the electrolyte may be maintained below a level of, for instance, about three and preferably between about two and three. The proper pH is maintained by including pH-sensing electrodes in the electroplating cell and/or the reservoir (see FIG. 32), and adding acid, for example, 12% perchloric acid ("HClO$_4$"), or base, as needed, with metering pumps to the electroplating cell and/or the reservoir when the sensed pH rises above a threshold level. During an ordinary electroplating process, the pH of the electrolyte increases, requiring continued addition of acid to maintain a particular pH level.

A fifth characteristic includes filtering the electrolyte in the reservoir at a sufficiently high rate with a microporous filter, such as a 0.2 μm filter or better, to remove microscopic particles produced by the electroplating process such that a complete turn of the electrolyte volume in the electroplating cell and the reservoir may be one minute or less. Sixth, an anode should be provided of an iron-cobalt alloy, preferably about four atomic percent cobalt and 96 atomic percent iron alloy circular anode (e.g., an anode with about 130 millimeter diameter and 10 millimeter thick from Sophisticated Alloys, Inc. of Butler, Pa. Seventh, the anode should be enclosed within a semipermeable membrane in the electroplating cell and the electrolyte should be filtered inside the volume contained by the semipermeable membrane with a 0.2 μm filter or better, to prevent contamination of the electrolyte in the vicinity of the wafer being electroplated.

Thus, an electroplating tool and related method have been introduced that accommodate electroplating onto a wafer a magnetically anisotropic layer that can sustain a high magnetic field density without saturation and with low power dissipation at a high excitation frequency, the magnetically anisotropic layer advantageously including an iron-cobalt-phosphorous alloy. The process can produce an electroplated layer of an alloy such as an iron-cobalt-phosphorous alloy with minimal variability over the wafer surface, and can sustain continued and repeatable operation in a manufacturing environment.

In an advantageous embodiment, the electroplating tool includes a reservoir having a cover configured to substantially seal the reservoir to an outside atmosphere during an electroplating process, and a porous tube couplable to an inert gas source configured to bubble an inert gas through an electrolyte containable therein. The electroplating tool also includes an electroplating cell, coupled to the reservoir, having another cover configured to substantially seal the electroplating cell to an outside atmosphere during an electroplating process, and another porous tube couplable to an inert gas source configured to bubble an inert gas through an electrolyte containable therein. The electroplating cell also includes an anode, encased in an envelope of a semipermeable membrane, formed with an alloy of electroplating material, and a magnet configured to orient an axis of magnetization of the electroplating material for application to a wafer couplable thereto during an electroplating process. The electroplating tool further includes a circulating pump coupled through a tube with a valve to the electroplating cell and the reservoir. The circulating pump is configured to pump the electrolyte at a flow rate from the reservoir through the tube to the electroplating cell through nozzles therein. The electroplating tool still further includes another circulating pump and microporous filter coupled through a tube to the electroplating cell and the reservoir. The another circulating pump is configured to pump the electrolyte through the microporous filter from the reservoir through the tube to the electroplating cell and the reservoir.

The electrolyte chemistry and procedures to support electroplating a magnetic alloy such as an iron-cobalt-phosphorous alloy will now be described. Additions to the material formulations described below to provide further enhanced properties are contemplated and can be readily made within the broad scope of the invention.

In electrolytes of the prior art employed to electroplate a magnetic alloy such as Permalloy, the iron, cobalt, and other electrolyte components include aqueous sulfates with pH of approximately three, are not buffered, and utilize an iron anode. The electrolyte as described herein includes aqueous perchlorates of iron, cobalt, and other electrolyte components, with a pH of approximately two, is preferably buffered, and uses an iron-cobalt alloy anode. In an advantageous embodiment, the pH is buffered in the range of about two to three, and preferably less than about three. Other improvements of the electrolyte include neutralizing excess acid therein with ammonium bicarbonate, and using a higher current density during an electroplating operation.

While the electrolytes of the prior art are unstable with continued use, the electrolyte as described herein is more robust. Higher electroplating rates are possible using the electrolyte as described herein, and are reproducible from substrate to substrate, which is not the case using electrolytes of the prior art. By using an iron-cobalt alloy anode as described herein, the cobalt in the electrolyte is continuously replenished. Phosphorus is replenished by adding electrolyte containing a phosphorous salt as described below.

Preparation of an exemplary 30-liter perchlorate electrolyte for an iron-cobalt-phosphorous ternary alloy will now be described. The electrolyte can be modified to add, without limitation, any or all of a trace amount (e.g., less than about 10 millimolar) of elements such as sulfur, vanadium, tungsten, and copper.

The electrolyte (e.g., 24 liters ("L") of water) is first deoxygenated by bubbling nitrogen for 15-30 minutes. Chemicals are then added preferably in the order given below. An iron perchlorate is preferably ground into a powder before adding to a mixing tank since it is usually lumpy as received from a vendor in bulk form. Since the iron in solution is air sensitive, the solution should be prepared and stored under a nitrogen or other atmosphere inert to the chemical constituents. A polyethylene mixing tank with a recirculating pump and 0.2-μm or better filter may be used in an advantageous embodiment of the invention.

In an exemplary embodiment, the materials as listed below in Table I include components to produce 30 L of electrolyte.

TABLE I

| CHEMICAL | GRAMS TO MAKE 30 L | pH |
|---|---|---|
| Water, $N_2$ | 24 kg (liters) | ~7.0 |
| Ascorbic Acid | 0.01 M → 52.84 g | 3.13 |
| Sodium Hypophosphite $NaH_2PO_2 \cdot H_2O$ | 0.08 M → 254.38 g | 3.07 |
| Ammonium Perchlorate $(NH_4)ClO_4$ | 0.50 M → 1762.5 g | 2.87 |
| Ferrous Perchlorate $Fe(ClO_4)_2 \cdot 6H_2O$ | 0.65 M → 7075.4 g | 0.60 |
| Cobalt Perchlorate $CoClO_4 \cdot 6H_2O$ | 0.006 M → 66.01 g | 0.60 |

Due to excess perchloric acid in the (hydrated) ferrous perchlorate, the acid should be neutralized to raise the pH. Raising the pH should be done slowly to avoid precipitation of iron hydroxides and oxidation to ferric iron. In general, the pH should be kept less than about three. Ammonium bicarbonate solution (e.g., 150 grams/L) is added drop-wise with vigorous stirring under nitrogen or other inert atmosphere. A white precipitate may form when the neutralizing solution comes in contact with the electrolyte, but if agitation is sufficient, it immediately redissolves without detrimental effect. A metering pump is preferably used to add the neutralizing solution. The pump rate is initially set at about 10 milliliters ("ml") per minute.

A pH meter is used to monitor the pH in the mixing tank. The glass electrode of the pH meter often requires changing the supporting electrolyte therein from saturated potassium chloride ("KCl") to one molar ammonium perchlorate. Failure to follow this procedure will generally result in inaccurate pH readings. The meter is preferably calibrated with pH equaling one and two buffers with measurement to an accuracy of 0.01 unit. The pH rises slowly at first, then more rapidly when the pH is above one. When the pH reaches a target value of 1.95, water is added to bring the volume to 30 L.

Some brown precipitate remains in the solution in the mixing tank from impurities in the iron perchlorate, but it can be removed by filtering in an hour or less, depending on the pump rate in the mixing tank. The solution can be monitored spectrophotometrically to check for suspended particles and their concentrations. For example, at 400 nanometers ("nm"), an unfiltered solution (one centimeter path length) has a baseline absorbance of A=0.0400, and after filtering, A=0.0046. Iron is kept in the ferrous state by ascorbic acid, which needs periodic monitoring. A Hach ascorbic acid test kit can be used to determine the ascorbic acid concentration. The ascorbic acid absorbs strongly below 300 nm, and a convenient measure of the "health" of the electrolyte is the "wavelength cutoff," λc, defined as the wavelength at which the absorption of a one centimeter cm path is one. A newly prepared solution has λc=291 nm and, as the solution ages, the wavelength cutoff moves to longer wavelengths. As long as λc<300 nm and the ascorbic acid concentration is 0.01 M, the electrolyte should be useable. Without a nitrogen atmosphere, ascorbic acid and iron oxidize, and the wavelength cutoff shifts into the visible range rapidly.

For unpatterned substrates (i.e., for substrates that have not been patterned and processed with a photoresist), conditions for good electroplating results with vigorous electrolyte agitation are listed in Table II below:

TABLE II

| pH | Co (M) | mA/cm$^2$ | CE (%) | μm/seconds |
|---|---|---|---|---|
| 2.0 | 0.006 | 22 | 50-56 | 210-230 |

A higher pH gives a larger current efficiency ("CE"), but lowering the pH allows a larger current density ("mA/cm$^2$") and electroplating rate ("μm/seconds"). For patterned substrates, increasing the current density ("CD") by about 10% over the current density for un-patterned substrates may be necessary to optimize current density, current efficiency, etc., in a manufacturing environment. During an electroplating operation, the pH of the electrolyte will rise. To lower the electrolyte pH, 12% perchloric acid is added, preferably using a metering pump.

An iron-cobalt-phosphorous alloy is stained in water. Rinsing the alloy without damage can be performed by saturating the rinse water with carbon dioxide (e.g., bubbling carbon dioxide through the rinse water for five minutes). Drying the alloy quickly with nitrogen blow-off will then prevent the formation of brown stains on the alloy surface.

Sometimes, however, hand drying of the substrate can still allow some oxidation to occur. An alternative procedure for eliminating any staining of the alloy during drying is to electroplate a thin (e.g., 300 Å) layer of nickel on the iron-cobalt-phosphorous alloy. For example, after rinsing the substrate in water saturated with carbon dioxide, the cathode assembly is placed, still wet, into a sulfamate solution containing 1 M of $Ni(SO_3NH_2)_2$, 0.03 M of $NiCl_3$, 0.6 M of $H_3BO_3$ at pH=4 and a nickel anode. Electroplating at a current density of 2 mA/cm$^2$ for about one minute produces a nickel layer thick enough (approximately 250 Å) to protect the ferrous alloy from oxidizing in water.

Preferably, the addition of a buffer (e.g., up to about 0.1 molar) to the electrolyte can help to maintain the surface pH low if agitation from the electroplating tool is insufficient to produce a bright and shiny deposit, which is a necessary but not sufficient condition for a good deposit. A non-complexing organic acid can be used if it has sufficient solubility and the proper acidity constant, $K_a$. At first order, an effective buffer should have its logarithm acidity constant $pK_a$ close to the target pH. The situation is complicated by the fact that the electrolyte is highly concentrated with salts (i.e., it has high ionic strength). The logarithm acidity constant $pK_a$ of an acid is a function of ionic strength according to the Debye-Hückel equation:

$$\Delta pK_a = pK_a' - pK_a = (2za-1)[(A(I)^{1/2})/(1+(I)^{1/2})-0.1I],$$

wherein za is the charge on the conjugate acid species, A is a constant (A=0.51 for 20-30° C.), I is the ionic strength, and $pK_a'$ is the actual logarithm acidity constant $pK_a$ in the ionic medium. Two cases of interest are summarized in Table III below, where "AP" is ammonium phosphate, and "SHP" is sodium hypophosphite.

TABLE III

| CASE | FE | AP | SHP | CO | I | $\Delta pK_a$ |
|---|---|---|---|---|---|---|
| 1 | 0.65 | 0.50 | 0.015 | 0.015 | 0.39 | −0.137 |
| 2 | 1.00 | 0.50 | 0.015 | 0.015 | 2.03 | −0.097 |

Two acids that have good solubility and are not strong complexing agents for iron and cobalt are malonic acid ($CH_2(COOH)_2$, $pK_a$=2.83) and sarcosine ($CH_3NHCH_2COOH$, $pK_a$=2.21). Since the cathode consumes hydrogen H+, the highest buffering action occurs when the pH is below the $pK_a'$, so malonic acid should be a good buffer with an electrolyte at pH=2.5, and sarcosine should be a good buffer with an electrolyte at pH=2.0.

A phosphorous donor such as sodium hypophosphate in a 90 L electrolyte is preferably replenished on a maintenance basis using a metering pump after 1.3 grams thereof have been consumed (e.g., after electroplating about 3-4 eight-inch substrates, each electroplated 3.5 μm thick). Sodium hypophosphite is preferably added using an estimated consumption based on the percentage of phosphorus in the electroplated deposit such as demonstrated in a substrate electroplating log. It should be understood that other donors such as boron may be included in the electrolyte.

Thus, an electrolyte has been introduced including water, ascorbic acid, a donor such as a phosphorous donor (e.g., sodium hypophosphite), ammonium perchlorate, ferrous perchlorate, cobalt perchlorate, and a buffering agent of malonic acid, sarcosine, methanesulfonylacetic acid, phenylsulfonylacetic acid, and/or phenylmalonic acid. In an advantageous embodiment employable with an electroplating tool, a pH meter is immersed in the electrolyte to monitor its pH and the electrolyte is filtered with a microporous filter (e.g., 0.2-μm filter or better). In an advantageous embodiment employable with an electroplating tool, the electrolyte is substantially sealed to the atmosphere with a cover, and a substantially inert atmosphere is maintained above the electrolyte. An inert gas (e.g., nitrogen) is bubbled through the electrolyte to remove oxygen.

Ammonium bicarbonate solution advantageously is added to the electrolyte during an electroplating operation and during solution preparation to raise a pH thereof to approximately two. In a further advantageous embodiment, ammonium bicarbonate solution is added to the electrolyte during an electrolyte preparation or an electroplating operation to raise a pH thereof in the range of about two to three. In an advantageous embodiment, the ammonium bicarbonate solution has a concentration of 150 grams per liter, and is added drop wise with agitation to the electrolyte. In one embodiment, phosphorus in the electrolyte is replenished during an electroplating operation by adding electrolyte containing a phosphorous salt. In an advantageous embodiment, the phosphorous salt is sodium hypophosphite.

In a further embodiment employable with an electroplating tool, an iron-cobalt anode is held in the electrolyte, wherein the iron-cobalt anode is substantially four atomic percent cobalt and 96 atomic percent iron. In a further advantageous embodiment, the iron-cobalt anode includes sulfur, vanadium, tungsten, copper, and/or combinations thereof, with a concentration in the range of 1 to 100 ppm. In a further embodiment employable with an electroplating tool, a substrate is held in the electrolyte, and the substrate is advantageously mounted in a magnetic field. In a further advantageous embodiment, the magnetic field is a rotating magnetic field. In a further advantageous embodiment, the magnetic field is produced with a current-carrying coil.

Conductive films such as copper films, particularly copper films formed on a silicon substrate by an electrodeposition process (e.g., the first conductive winding layer 423 illustrated and described with reference to FIG. 9 above), generally develop mechanical stress after exposure to high downstream process temperatures. High downstream temperatures are encountered in processing steps such as sputtering and curing of a photoresist. Development of film stress in copper is a consequence of copper having a higher coefficient of thermal expansion than silicon. Elevated temperatures thus lead to preferential expansion of the copper film and the development of a compressive stress therein at an elevated temperature by the less expansive silicon. Copper films approach the copper yield stress in compression at 250° C., and again in tension when returned to room temperature. Copper films show significant stress development even after exposure to temperatures as low as 110° C. The effect of such stress is to induce a bow in the substrate on which it is deposited when the substrate is cooled to room temperature. For example, the substrate 401 illustrated in FIG. 9 can develop a bow due to mismatch of the coefficients of thermal expansion of the substrate 401 and the first conductive winding layer 423.

The substrate or wafer bow is the amount of deflection at the edges thereof from a plane tangent to the center of the substrate. The radius of curvature and substrate bow depend on thickness of the copper film relative to the thickness of the silicon substrate. To prepare such a substrate with an electrodeposited copper film for further processing steps, it is important to reduce the substrate bow, particularly the bow of a patterned substrate. Unrelieved copper stress can lead to later increased room-temperature film stress by inducing grain growth or by causing sufficient mismatched thermal expansion stress to plastically deform the film.

A substantial portion of the residual copper film stress can be relieved in an advantageous embodiment by reducing the substrate temperature to a stress-compensating temperature (e.g., well below room temperature). Even modest below-room temperature excursions lead to plastic film deformation, making the film more compressive and closer to a stress-free level when the substrate temperature returns to room temperature or to an expected operating temperature. In effect, the reverse phenomenon is utilized to relax the residual mechanical stress present at room temperature in a copper film.

In an advantageous embodiment, a substrate after electrodeposition of a copper film is gradually cooled to well below room temperature (e.g., −75 degrees Celsius) by placing the substrate in a suitable refrigeration device at room temperature and turning on the device cooling mechanism such as the device compressor. In an advantageous embodiment, the substrate is maintained at a temperature of −75 degrees Celsius for a period of 24 hours to obtain substantial stress relief. In a further advantageous embodiment, the substrate is maintained at a temperature of −75 degrees Celsius for a period of six hours to obtain substantial stress relief. In a further advantageous embodiment, other low annealing temperatures to provide stress relief are contemplated. For example, a substrate can be placed inside a closed flat-pack in an operating refrigeration device to slow the substrate cooling rate. In a further advantageous embodiment, a substrate cassette containing a plurality of substrates can be placed inside an operating refrigeration device to slow the wafer cooling rate. After annealing at −75 degrees Celsius, the temperature of the substrate is gradually returned to room temperature. For example, the substrate can be gradually returned to room temperature over a period of one hour.

When taken from a freezer at −75 degrees Celsius and warmed to room temperature, a substrate may become wet with condensation. If condensation forms on the substrate surface, the substrate is preferably placed in front of a fan to fully bring its temperature to room temperature, and is then dried with a nitrogen gun.

Detailed procedures for ramping substrate temperatures to room temperature in a production environment would depend on the available equipment. For instance, a freezer with programmable heating and cooling profiles may be used, thereby avoiding or reducing condensation on the surface of a substrate. Alternatively, the refrigeration and heating process can take place in a vacuum device to reduce or even prevent condensation. By performing an annealing process, a substantial portion of the residual stress in a copper film deposited on a silicon substrate can be relieved, often reducing wafer bow by 90% or more.

Thus, a method of processing a substrate with a conductive film is introduced to reduce mechanical stress therein after exposure to high downstream process temperatures. In an advantageous embodiment, the substrate is a silicon, glass, or ceramic substrate. In an advantageous embodiment, the conductive film is formed on the silicon substrate by an electroplating process.

The method includes reducing the temperature of the substrate to a stress-compensating temperature well below room temperature and maintaining the temperature of the substrate at the stress-compensating temperature for a period of time. In an advantageous embodiment, the period of time is one to 24 hours. The method further includes increasing the temperature of the substrate to room temperature. In an advantageous embodiment, reducing the temperature of the substrate includes gradually reducing the temperature of the substrate at rate of approximately one degrees Celsius per minute. In an advantageous embodiment, the stress-compensating temperature is a temperature of less than zero degrees Celsius. In a further advantageous embodiment, increasing the temperature of the substrate to room temperature is performed over a period of one to two hours.

In a further advantageous embodiment, the substrate is dried with inert gas within an inert gas environment after the increasing the temperature of the substrate to room temperature. In an advantageous embodiment, the inert gas is nitrogen, and the inert gas environment advantageously is a nitrogen environment.

In a related embodiment, a method of forming a micromagnetic device is introduced herein that includes forming an insulating layer over a substrate, forming a conductive winding layer over the insulating layer, forming another insulating layer over the conductive winding layer, and forming a magnetic core layer over the another insulating layer. The method also includes reducing a temperature of the micromagnetic device to a stress-compensating temperature, maintaining the temperature of the micromagnetic device at the stress-compensating temperature for a period of time, and increasing the temperature of the micromagnetic device above the stress-compensating temperature.

Those skilled in the art should understand that the previously described embodiments of the micromagnetic devices, related methods, power converter employing the same, electroplating tool and electrolyte, and method of processing a substrate and micromagnetic device are submitted for illustrative purposes only and that other embodiments capable of producing the same are well within the broad scope of the invention. Additionally, exemplary embodiments of the invention have been illustrated with reference to specific electronic components, reagents, and processes. Those skilled in the art are aware, however, that other components reagents, and processes may be substituted (not necessarily with elements of the same type) to create desired conditions or accomplish desired results. For instance, multiple components may be substituted for a single component and vice-versa.

The principles of the invention may be applied to a wide variety of power converter topologies. While the micromagnetic devices, related methods, electroplating tool and electrolyte, and method of processing a substrate and micromagnetic device have been described in the environment of a power converter, those skilled in the art should understand that the aforementioned and related principles of the invention may be applied in other environments or applications such as a power amplifier or signal processor.

For a better understanding of power converters see "Modern DC-to-DC Switchmode Power Converter Circuits," by Rudolph P. Severns and Gordon Bloom, Van Nostrand Reinhold Company, New York, N.Y. (1985) and "Principles of Power Electronics," by J. G. Kassakian, M. F. Schlecht and G. C. Verghese, Addison-Wesley (1991). The aforementioned references are incorporated herein by reference in their entirety.

Although the invention has been described in detail, those skilled in the art should understand that they can make various changes, substitutions and alterations herein without departing from the spirit and scope of the invention in its broadest form.

What is claimed is:

1. A power converter, comprising:
   a power train, including:
      a switch configured to conduct for a duty cycle and provide a regulated output characteristic at an output of said power converter, and
      a micromagnetic device, interposed between said switch and said output of said power converter, including:
         a substrate, and
         a magnetic core layer formed over said substrate from a magnetic alloy including iron, cobalt, phosphorous, and vanadium or tungsten, wherein a content of said vanadium or tungsten is at least one part per million, a content of said cobalt is in a range of 1.8 to 4.5 atomic percent, a content of said phosphorus is in a range of 20.1 to 30 atomic percent, and a content of said iron is substantially a remaining proportion of said magnetic alloy;
   a controller configured to provide a signal to control said duty cycle of said switch; and
   a driver configured to provide a drive signal to said switch as a function of said signal from said controller.

2. The power converter as recited in claim 1 wherein said magnetic alloy further includes one of the group consisting of sulfur, copper, and combinations thereof, with a concentration in a range of 1 to 100 parts per million.

3. The power converter as recited in claim 1 wherein said magnetic alloy is an amorphous or nanocrystalline magnetic alloy.

4. The power converter as recited in claim 1 wherein said micromagnetic device further includes an insulating layer between said substrate and said magnetic core layer.

5. The power converter as recited in claim 1 wherein said micromagnetic device further includes a conductive winding layer and an insulating layer between said substrate and said magnetic core layer.

6. The power converter as recited in claim 1 wherein said micromagnetic device further includes an adhesive layer between said substrate and said magnetic core layer.

7. The power converter as recited in claim 1 wherein said micromagnetic device further includes a seed layer between said substrate and said magnetic core layer.

8. The power converter as recited in claim 1 wherein said micromagnetic device further includes a protective layer over said magnetic core layer.

9. The power converter as recited in claim 1 wherein said micromagnetic device further includes an insulating layer over said magnetic core layer.

10. The power converter as recited in claim 1 wherein said micromagnetic device further includes an insulating layer and a conductive winding layer over said magnetic core layer.

11. A power converter, comprising:
    a power train, including:
       a switch configured to conduct for a duty cycle and provide a regulated output characteristic at an output of said power converter, and
       a micromagnetic device, interposed between said switch and said output of said power converter, including:
          a substrate,
          a magnetic core layer formed over said substrate from a magnetic alloy,
          an insulating layer formed over said magnetic core layer, and
          another magnetic core layer formed over said insulating layer from a magnetic alloy, wherein at least one of said magnetic alloys include iron, cobalt, phosphorous, and vanadium or tungsten, and a content of said vanadium or tungsten is at least one part per million, a content of said cobalt is in a range of 1.8 to 4.5 atomic percent, a content of said phosphorus is in a range of 20.1 to 30 atomic percent, and a content of said iron is substantially a remaining proportion of said at least one of said magnetic alloys,
    a controller configured to provide a signal to control said duty cycle of said switch; and
    a driver configured to provide a drive signal to said switch as a function of said signal from said controller.

12. The power converter as recited in claim 11 wherein said at least one of said magnetic alloys further include one of the group consisting of sulfur, copper, and combinations thereof, with a concentration in a range of 1 to 100 parts per million.

13. The power converter as recited in claim 11 wherein at least one said magnetic alloys is an amorphous or nanocrystalline magnetic alloy.

14. The power converter as recited in claim 11 wherein said micromagnetic device further includes a conductive winding layer and another insulating layer between said substrate and said magnetic core layer.

15. The power converter as recited in claim 11 wherein said micromagnetic device further includes an adhesive layer and a seed layer between said substrate and said magnetic core layer.

16. The power converter as recited in claim 11 wherein said micromagnetic device further includes a protective layer between said magnetic core layer and said insulating layer.

17. The power converter as recited in claim 11 wherein said micromagnetic device further includes an adhesive layer and a seed layer between said insulating layer and said another magnetic core layer.

18. The power converter as recited in claim 11 wherein said micromagnetic device further includes a protective layer over said another magnetic core layer.

19. The power converter as recited in claim 11 wherein said micromagnetic device further includes another insulating layer over said another magnetic core layer.

20. The power converter as recited in claim 11 wherein said micromagnetic device further includes another insulating layer and a conductive winding layer over said another magnetic core layer.

* * * * *